United States Patent
Wu et al.

(10) Patent No.: US 9,357,188 B2
(45) Date of Patent: May 31, 2016

(54) PHOTOGRAPHY AND PROJECTION APPARATUS AND LIGHT EMITTING AND SENSING MODULE

(75) Inventors: Ming-Hsien Wu, Tainan (TW); Wen-Yung Yeh, Hsinchu County (TW); Chia-Hsin Chao, Taichung (TW); Mu-Tao Chu, Hsinchu (TW); Jui-Ying Lin, Taipei (TW)

(73) Assignee: Industrial Technology Research Institute, Hsinchu (TW)

( * ) Notice: Subject to any disclaimer, the term of this patent is extended or adjusted under 35 U.S.C. 154(b) by 863 days.

(21) Appl. No.: 13/304,706

(22) Filed: Nov. 28, 2011

(65) Prior Publication Data
US 2013/0135507 A1 May 30, 2013

(51) Int. Cl.
*H04N 5/225* (2006.01)
*H04N 5/235* (2006.01)
*H04N 9/31* (2006.01)
*H01L 27/15* (2006.01)

(52) U.S. Cl.
CPC ........... *H04N 9/3138* (2013.01); *H04N 5/2256* (2013.01); *H04N 5/2354* (2013.01); *H04N 9/3176* (2013.01); *H01L 27/15* (2013.01)

(58) Field of Classification Search
CPC . H04N 9/3138; H04N 9/3176; H04N 5/2354; H04N 5/2256; H01L 27/15; H01L 29/872; H01L 21/823857; H01L 29/417; H01L 27/0629; H01L 21/823878; H01L 29/0619; H01L 2924/0002
USPC ........................................................ 348/294
See application file for complete search history.

(56) References Cited

U.S. PATENT DOCUMENTS

| 5,258,844 | A | 11/1993 | Nakayama et al. |
| 6,661,578 | B2 | 12/2003 | Hedrick |
| 6,720,942 | B2 | 4/2004 | Lee et al. |
| 7,064,733 | B2 | 6/2006 | Cok et al. |

(Continued)

FOREIGN PATENT DOCUMENTS

| CN | 1353410 | 6/2002 |
| CN | 1802683 | 7/2006 |

(Continued)

OTHER PUBLICATIONS

"Office Action of China Counterpart Application", issued on Jun. 10, 2014, p, 1-p. 10.

(Continued)

*Primary Examiner* — Roberto Velez
*Assistant Examiner* — Tuan Le
(74) *Attorney, Agent, or Firm* — Jianq Chyun IP Office

(57) ABSTRACT

A photography and projection apparatus including a light emitting and sensing module and a projection lens is provided. The light emitting and sensing module has a light emitting and sensing area, and includes a light emitting unit array and a light sensing unit array. The light emitting unit array includes a plurality of light emitting units arranged in an array. The light emitting units are distributed in the light emitting and sensing area. The light emitting unit array is adapted to provide an image beam. The light sensing unit array includes a plurality of light sensing units arranged in an array. The light sensing units are distributed in the light emitting and sensing area. The projection lens is disposed on a transmission path of the image beam. A light emitting and sensing module is also provided.

26 Claims, 24 Drawing Sheets

(56) References Cited

U.S. PATENT DOCUMENTS

| | | | |
|---|---|---|---|
| 7,300,160 B2 | 11/2007 | Nakamura | |
| 7,355,584 B2 | 4/2008 | Hendriks et al. | |
| 2001/0052597 A1* | 12/2001 | Young | G09G 3/3233 257/59 |
| 2002/0176015 A1 | 11/2002 | Lichtfuss | |
| 2003/0048239 A1* | 3/2003 | Cok et al. | 345/55 |
| 2005/0212045 A1 | 9/2005 | Tamai | |
| 2006/0124833 A1* | 6/2006 | Toda | 250/214 R |
| 2007/0040921 A1 | 2/2007 | Davis et al. | |
| 2008/0002154 A1 | 1/2008 | Ooishi | |
| 2008/0042241 A1* | 2/2008 | Chiang et al. | 257/536 |
| 2008/0051135 A1 | 2/2008 | Destain et al. | |
| 2008/0055555 A1 | 3/2008 | Nakamura et al. | |
| 2008/0101790 A1 | 5/2008 | Hagiwara | |
| 2008/0246042 A1 | 10/2008 | Ting | |
| 2009/0166643 A1* | 7/2009 | Schranz | 257/80 |

FOREIGN PATENT DOCUMENTS

| | | |
|---|---|---|
| CN | 1983013 | 6/2007 |
| CN | 1992296 | 7/2007 |
| CN | 201060361 | 5/2008 |
| CN | 101241958 | 8/2008 |
| CN | 100492158 | 5/2009 |
| CN | 100539179 | 9/2009 |
| CN | 201477341 | 5/2010 |
| JP | 2005173019 | 6/2005 |
| TW | 548966 | 8/2003 |
| TW | M261700 | 4/2005 |
| TW | M308583 | 3/2007 |
| TW | I327018 | 7/2010 |

OTHER PUBLICATIONS

"Office Action of Taiwan Counterpart Application", issued on Jun. 25, 2013, p. 1-p. 5.

Z. Gong, et al., "Flip-chip, micro-pixellated InGaN light-emitting diode arrays: attractive sources for micro-displays, colour conversion, and fluorescence detection", Phys. Status Solidi C 6, No. S2, 2009, p. s847-s851.

B R Rae. et al., "CMOS driven micro-pixel LEDs integrated with single photon avalanche diodes for time resolved fluorescence measurements", Journal of Physics D: Applied Physics, No. 41, 2008, p. 1-6.

"Office Action of China Counterpart Application", issued on Jan. 20, 2014, p. 1-p. 12.

* cited by examiner

PHOTOGRAPHY AND PROJECTION APPARATUS AND LIGHT EMITTING AND SENSING MODULE

BACKGROUND

1. Technical Field

The disclosure relates to an optical apparatus and a module thereof, and more particularly to a photography and projection apparatus and a light emitting and sensing module thereof.

2. Related Art

With the advance of photoelectrical technologies, volumes of many photoelectrical devices are gradually developed toward miniature, and recently projection apparatuses are further miniaturized, so that they can be disposed in portable electronic products such as a mobile phone, a personal digital assistant (PDA), a digital camera, a flat panel computer, and so on.

A conventional projection apparatus mainly includes three parts of an illumination system, a light valve and a projection lens. The illumination system is adapted to emit an illumination beam. The light valve is, for example, a digital micromirror device (DMD), a liquid-crystal-on-silicon (LCOS) panel, a transmissive liquid-crystal panel or other spatial light modulators, and has a function of modulating the illumination beam into an image beam. Then, the projection lens projects the image beam from the light valve onto a screen, so as to generate an image frame.

However, a distance from the illumination system to the light valve is needed so that the illumination beam can uniformly and efficiently be transmitted onto the light valve, which, however, greatly limits the miniature process of the projection apparatus. Moreover, in order to generate an image frame of full color, the illumination system at least needs to include a light source of three primary colors such as red, green, and blue, and further needs to combine the lights in the three colors and throw the combined light to a light combining device of the light valve, so that the miniature is also greatly limited.

A light path of the conventional projection apparatus occupies a great space, and if a light detection function needs to be added, a new light path inevitably needs to be added, thereby occupying a greater space. Therefore, if the light detection function is intended to be added in the conventional projection apparatus, it is uneasy for the projection apparatus to satisfy miniature demands.

SUMMARY

An embodiment of the disclosure provides a photography and projection apparatus, which includes a light emitting and sensing module and a projection lens. The light emitting and sensing module has a light emitting and sensing area, and includes a light emitting unit array and a light sensing unit array. The light emitting unit array includes a plurality of light emitting units arranged in an array. The light emitting units are distributed in the light emitting and sensing area. The light emitting unit array is adapted to provide an image beam. The light sensing unit array includes a plurality of light sensing units arranged in an array. The light sensing units are distributed in the light emitting and sensing area. The projection lens is disposed on a transmission path of the image beam.

Another embodiment of the disclosure provides a light emitting and sensing module, which includes a light emitting and sensing area, a light emitting unit array, a light sensing unit array and a circuit substrate. The light emitting unit array includes a plurality of light emitting units arranged in an array, wherein the light emitting units are distributed in the light emitting and sensing area. The light sensing unit array includes a plurality of light sensing units arranged in an array. The light sensing units are distributed in the light emitting and sensing area. The light emitting units and the light sensing units are disposed on the circuit substrate, and the circuit substrate includes a plurality of light emitting unit drive circuits and a plurality of light sensing unit drive circuits. The light emitting unit drive circuits are electrically connected to the light emitting units respectively. The light sensing unit drive circuits are electrically connected to the light sensing units respectively.

Several exemplary embodiments accompanied with figures are described in detail below to further describe the disclosure in details.

DETAILED DESCRIPTION OF DISCLOSED EMBODIMENTS

Figure 1:
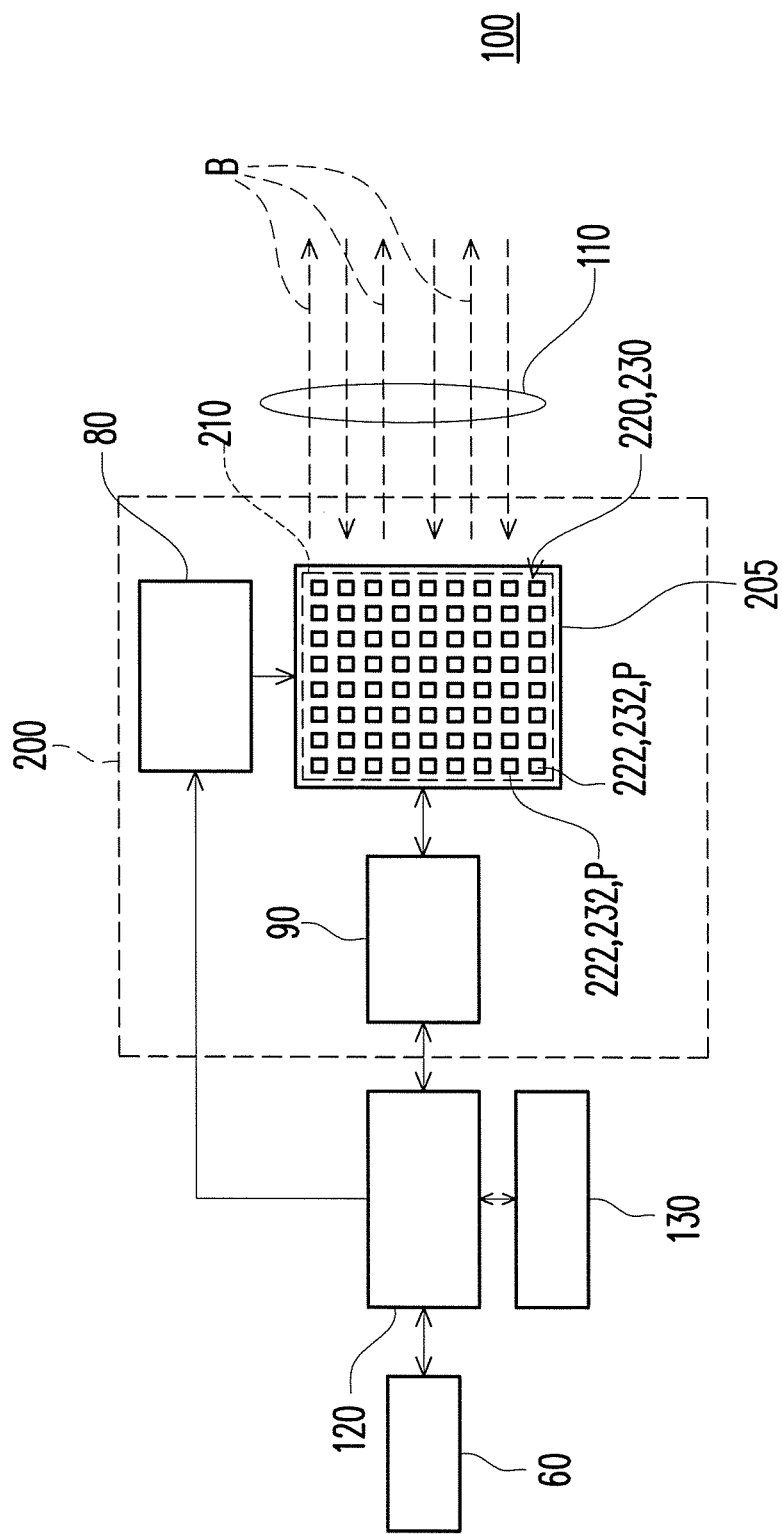
FIG. 1 is a block view of a photography and projection apparatus according to an embodiment of the disclosure.
Figure 2A:
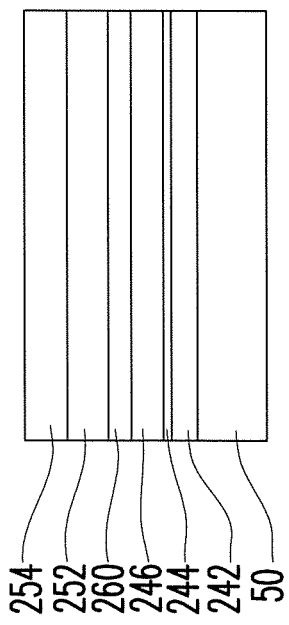
FIG. 2A is a schematic view of epitaxial structure in a process of manufacturing the light emitting and sensing module in FIG. 1.
Figure 2B:
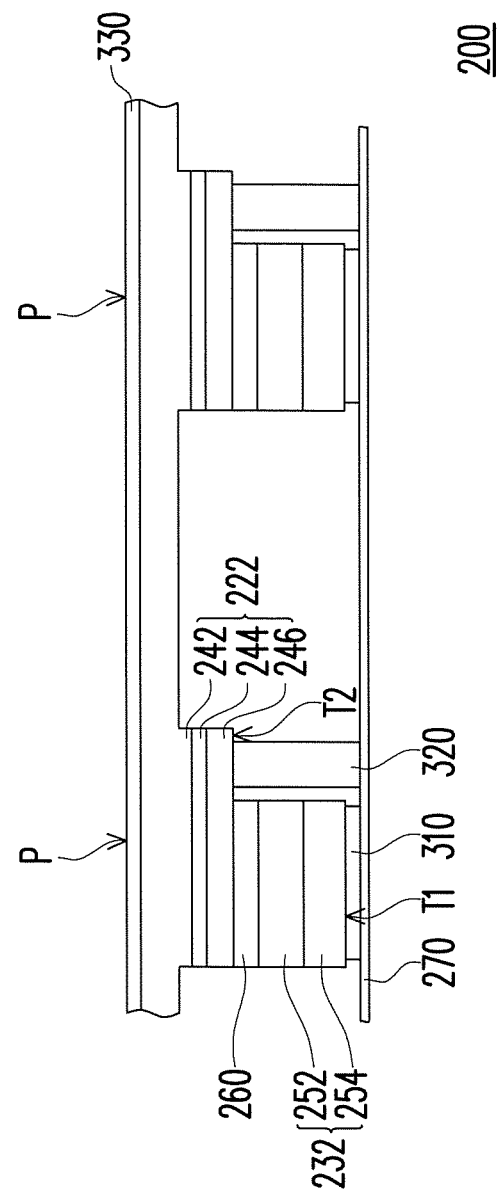
FIG. 2B is a schematic view of a local cross-section of the light emitting and sensing module in FIG. 1.
Figure 3:
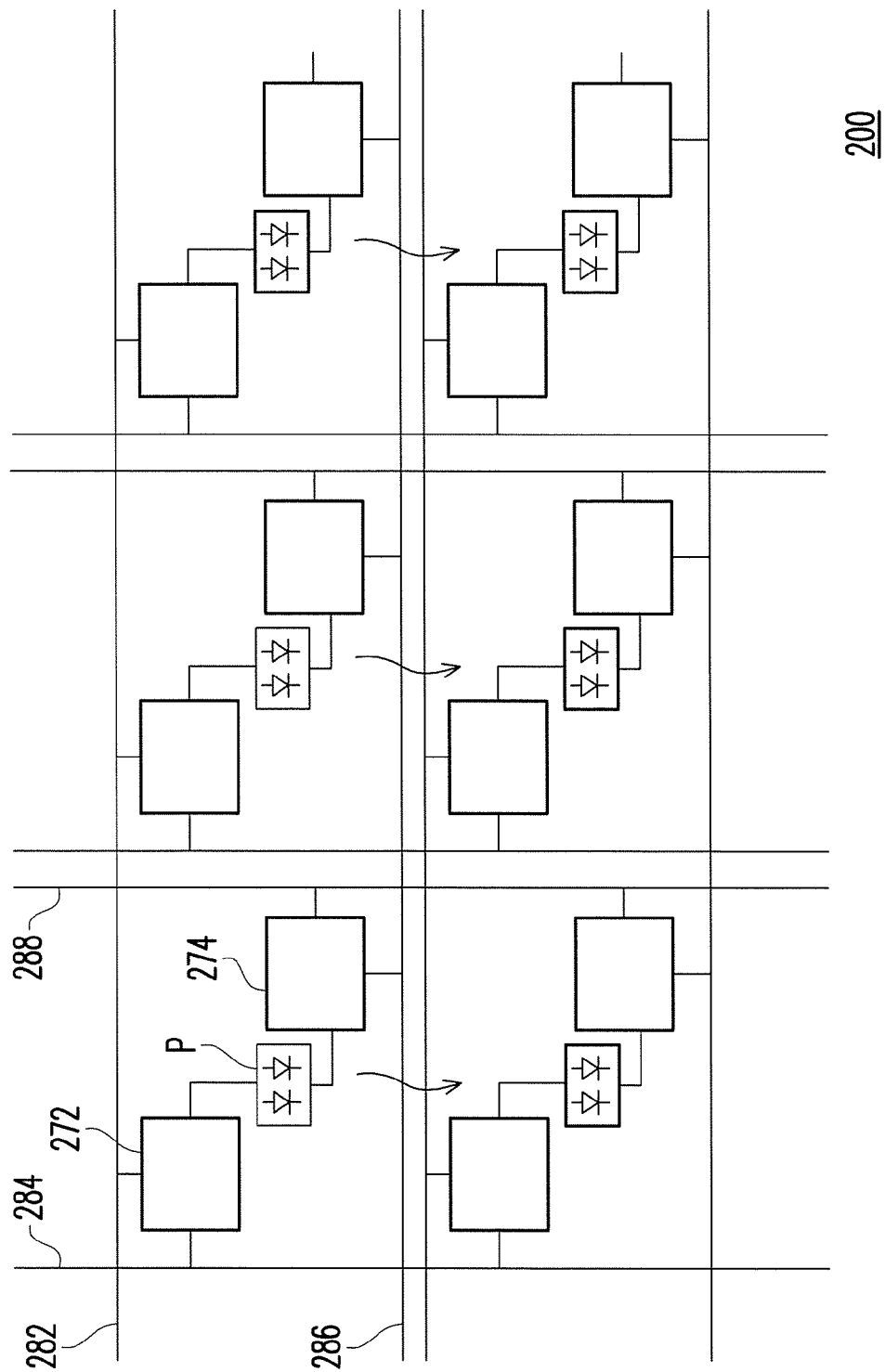
FIG. 3 is a local block view of the light emitting and sensing module in FIG. 1.

FIG. 1 is a block view of a photography and projection apparatus according to an embodiment of the disclosure, FIG. 2A is a schematic view of epitaxial structure in a process of manufacturing the light emitting and sensing module in FIG. 1, FIG. 2B is a schematic view of a local cross-section of the light emitting and sensing module in FIG. 1, and FIG. 3 is a local block view of the light emitting and sensing module in FIG. Referring to FIG. 1, FIG. 2A, FIG. 2B and FIG. 3, a photography and projection apparatus 100 of this embodiment includes a light emitting and sensing module 200 and a projection lens 110. The light emitting and sensing module 200 has a light emitting and sensing area 210, and the light emitting and sensing module 200 includes a light emitting unit array 220 and a light sensing unit array 230. The light emitting unit array 220 includes a plurality of light emitting units 222 arranged in an array, wherein the light emitting units 222 are distributed in the light emitting and sensing area 210, and the light emitting unit array 220 is adapted to provide an image beam B. The light sensing unit array 230 includes a plurality of light sensing units 232 arranged in an array, wherein the light sensing units 232 are distributed in the light emitting and sensing area 210. In this embodiment, the light emitting and sensing area 210 is, for example, an active area of a light emitting and sensing device 205, and the light emitting and sensing device 205 includes the light emitting unit array 220 and the light sensing unit array 230, wherein the light emitting and sensing device 205 is, for example, a light emitting and sensing chip. In addition, the projection lens 110 is disposed on a transmission path of the image beam B.

In this embodiment, the light emitting unit array 220 and the light sensing unit array 230 are overlapped with each other, as shown in FIG. 1 and FIG. 2B. In this embodiment, each light emitting unit 222 includes a first doped semiconductor layer 242, a second doped semiconductor layer 246 and a light emitting layer 244, wherein the light emitting layer 244 is disposed between the first doped semiconductor layer 242 and the second doped semiconductor layer 246. In this embodiment, the first doped semiconductor layer 242 is an N-type semiconductor layer, such as an N-type gallium nitride layer, the second doped semiconductor layer 246 is a P-type semiconductor layer, such as a P-type gallium nitride layer, and the light emitting layer 244 is, for example, a semiconductor quantum well layer. Moreover, in this embodiment, each light sensing unit 232 includes a third doped semiconductor layer 252 and a fourth doped semiconductor layer 254, wherein the fourth doped semiconductor layer 254 is connected to the third doped semiconductor layer 252, and the light sensing units 232 are stacked with the light emitting units 222 respectively. In other words, in this embodiment, the light emitting unit 222 is a light-emitting diode (LED) formed of semiconductor material, and the light sensing unit 232 is a photodiode formed of semiconductor material. In this embodiment, the third doped semiconductor layer 252 is an N-type doped semiconductor layer, such as an N-type indium gallium nitride layer, and the fourth doped semiconductor layer 254 is a P-type doped semiconductor layer, such as a P-type indium gallium nitride layer, wherein a junction of the third doped semiconductor layer 252 and the fourth doped semiconductor layer 254 may has high indium content, and the band gap can thus be controlled in an infrared light area (about 1.2 electronic volts), so as to be used to absorb blue light, green light and red light.

In this embodiment, the light emitting and sensing module 200 further includes a plurality of conductive connection layers 260, which respectively connects the light emitting units 222 and the light sensing units 232. The conductive connection layer 260 is, for example, a tunneling junction layer, which is, for example, a semiconductor layer having high dopant concentration.

The light emitting and sensing module 200 may further include a circuit substrate 270, and the light emitting units 222 and the light sensing units 232 are disposed on the circuit substrate 270. The circuit substrate 270 is, for example, a silicon substrate. In this embodiment, each light sensing unit 232 and a corresponding light emitting unit 222 form a pixel P, and the pixels P are disposed on the circuit substrate 270.

In this embodiment, the light emitting and sensing module 200 further includes a plurality of first electrodes 310, a plurality of second electrodes 320 and an electrode layer 330. The first electrodes 310 respectively connect the fourth doped semiconductor layers 254 of the light sensing units 232 of the pixels P and the circuit substrate 270, the second electrodes 320 respectively connect the second doped semiconductor layers 246 of the light emitting units 222 of the pixels P and the circuit substrate 270, and the electrode layer 330 is connected to the first doped semiconductor layers 242 of the light emitting units 222 of the pixels P.

In this embodiment, the circuit substrate 270 includes a plurality of light emitting unit drive circuits 272 and a plurality of light sensing unit drive circuits 274. The light emitting unit drive circuits 272 drive the light emitting units 222 respectively through the second electrodes 320 and the electrode layer 330, and the light sensing unit drive circuits 274 drive the light sensing units 232 respectively through the first electrodes 310 and the corresponding second electrodes 320. In this embodiment, the light emitting and sensing module 200 further includes a first driver 80 and a second driver 90, so as to respectively drive the light emitting unit drive circuits 272 and the light sensing unit drive circuits 274, wherein the first driver 80 and the second driver 90 are, for example, drive integrated circuits (drive ICs).

Reference may be made to FIG. 2A for the manufacturing process of the light emitting unit 222 and the light sensing unit 232, and firstly, the first doped semiconductor layer 242, the light emitting layer 244, the second doped semiconductor layer 246, the conductive connection layer 260, the third doped semiconductor layer 252 and the fourth doped semiconductor layer 254 are grown on a substrate 50 sequentially. Then, selective etching is performed on these layers, so that these layers form a mesa area T1 and a step area T2 as shown in FIG. 2B. Afterwards, the entire structure is inverted, and is bonded onto the circuit substrate 270 through the first electrode 310 and the second electrode 320. Then, the substrate 50 is removed. Afterwards, the electrode layer 330 is formed on the first doped semiconductor layer 242. In this embodiment, the second electrodes 320 are respectively located at one side of the light sensing units 232.

Referring back to FIG. 1, in this embodiment, the photography and projection apparatus 100 further includes a control unit 120, which is electrically connected to the light emitting unit array 220 and the light sensing unit array 230, so as to alternately drive the light emitting unit array 220 to emit light and drive the light sensing unit 232 to detect light. Specifically, the control unit 120 is electrically connected to the light emitting unit drive circuit 272 and the light sensing unit drive circuit 274, wherein the control unit 120 instructs the light emitting unit drive circuit 272 to drive the light emitting unit 222 to emit light, and instructs the light sensing unit drive circuit 274 to drive the light sensing unit 232 to detect light. In this embodiment, the first driver 80 is electrically connected between the control unit 120 and the light emitting unit drive circuit 272, and the second driver 90 is electrically connected between the control unit 120 and the light sensing unit drive circuit 274.

In this embodiment, the control unit 120 may receive image information 60, and then instructs the light emitting unit drive circuit 272 to drive the light emitting unit 222 to emit light according to the image information 60. The light emitting units 222 may emit light with different light intensity according to the image information 60 to form grey scale, and the projection lens 110 throws the image beam B onto a screen (not shown) to form an image frame. Additionally, the projection lens 110 is adapted to form an image of an external object on the light emitting and sensing area 210, so that the light sensing unit 232 in the light emitting and sensing area 210 is capable of detecting the image of the external object, and converting detected light signals into electric signals. The electric signals are transmitted to the control unit 120 through a light sensing unit drive circuit 274, and then the control unit 120 may store the electric signals into a memory 130.

As shown in FIG. 3, in this embodiment, the light emitting and sensing module 200 includes a plurality of light emitting unit selection lines 282, a plurality of light emitting unit data lines 284, a plurality of light sensing unit selection lines 286 and a plurality of light sensing unit reset lines 288. The light emitting unit selection lines 282 and the light sensing unit selection lines 286 are arranged into a plurality of rows, and the light emitting unit data lines 284 and the light sensing unit reset lines 288 are arranged into a plurality of columns. In this embodiment, the light emitting unit selection lines 282, the light emitting unit data lines 284, the light sensing unit selection lines 286 and the light sensing unit reset lines 288 are, for example, disposed in the circuit substrate 270, but the disclosure is not limited thereto. Each of the light emitting unit selection lines 282 is electrically connected to a row of light emitting unit drive circuits 272, and each of the light emitting unit data lines 284 is electrically connected to a column of light emitting unit drive circuits 272. Each light emitting unit drive circuit 272 is electrically connected to a pixel P. A signal from the light emitting unit selection line 282 decides which column of light emitting unit drive circuits 272 begins to drive the light emitting units 222 in the pixels P to emit light, and a signal from the light emitting unit data line 284 decides the magnitude of the current at which the light emitting unit 222 of the pixel P of the corresponding column is driven.

Additionally, the light sensing unit reset lines 288 decides which column of light sensing unit drive circuits 274 is instructed to drive the light sensing units 232 in the pixels P to high voltage, and the light sensing unit selection lines 286 decides which row of light sensing unit drive circuits 274 begins to read an electric signal into which the reset light sensing unit 232 converts a light signal.

Because the light emitting and sensing module 200 in the photography and projection apparatus 100 of this embodiment can integrate the light emitting unit array 220 and the light sensing unit array 230 together, the light emitting and sensing module 200 may have small volume, and have both display (or projection display) and light detection functions. Moreover, because the light emitting and sensing module 200 may directly emit an image beam, instead of being like the case that a conventional projection apparatus adopts a light valve to convert an illumination beam generated by an illumination system into an image beam, the photography and projection apparatus 100 of this embodiment may save the space occupied by the light path of the illumination beam in the prior art, thereby effectively shrinking the volume of the photography and projection apparatus 100 of this embodiment. In this way, the photography and projection apparatus 100 of this embodiment is appropriately mounted in a portable electronic apparatus (for example, a mobile phone, a PDA, a digital camera, or a flat panel computer), does not occupy excessive volume, and can further shrink the entire volume of the portable electronic apparatus. Additionally, the light sensing unit array 230 may also be utilized to detect the light emitted by the light emitting unit array 220, so as to perform image correction or adjustment (for example, color adjustment and correction, or brightness adjustment and correction).

Figure 4:
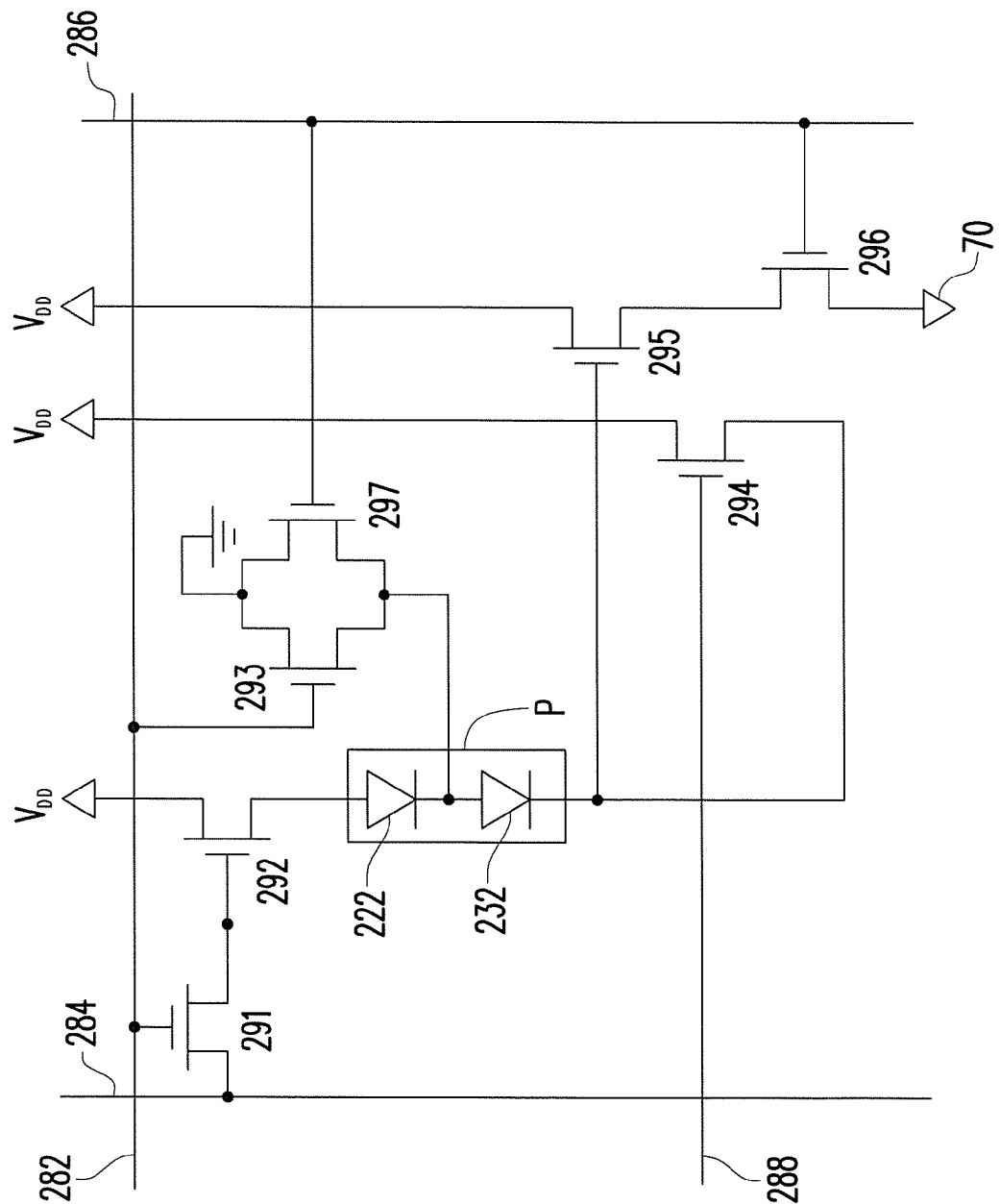
FIG. 4 is a drive circuit diagram of a pixel of a light emitting and sensing module according to another embodiment of the disclosure.
Figure 5:
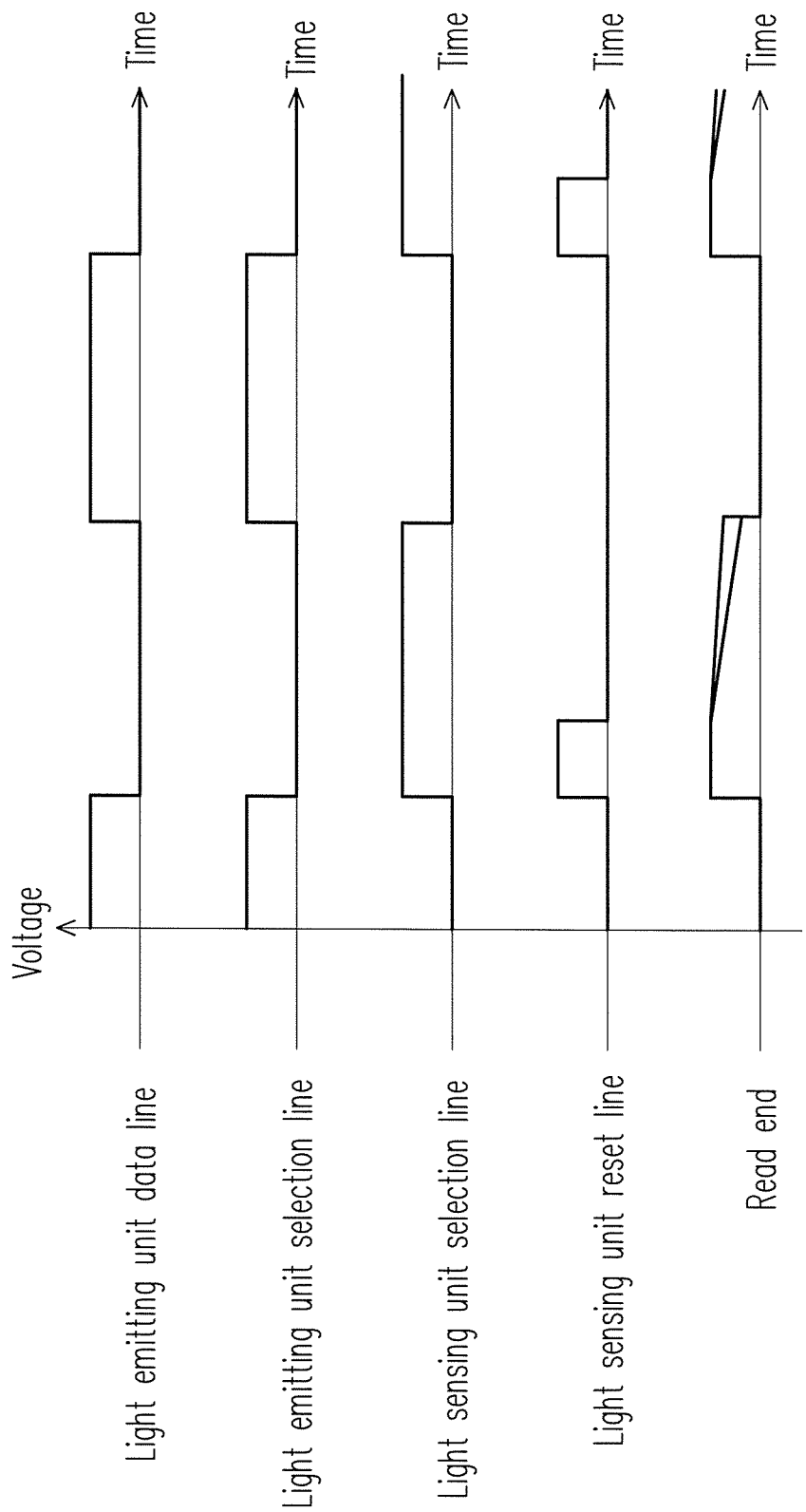
FIG. 5 is a drive oscillogram of a pixel in the light emitting and sensing module in FIG. 4.

FIG. 4 is a drive circuit diagram of a pixel of a light emitting and sensing module according to another embodiment of the disclosure, and FIG. 5 is a drive oscillogram of a pixel in the light emitting and sensing module in FIG. 4. Referring to FIG. 4 and FIG. 5, a drive circuit of the light emitting and sensing module of this embodiment is applicable to the light emitting and sensing module 200 or light emitting and sensing modules of other embodiments. Firstly, when a light emitting unit selection line 282 is at high voltage, a transistor 291 is turned on, and in this case, voltage of a light emitting unit data line 284 may be input to a gate of a transistor 292, so as to adjust energy input by a voltage source $V_{DD}$ to a light emitting unit 222 in the pixel P, so that the light emitting unit 222 emits light. In this case, the transistor 293 is also turned on, and the cathode of the light emitting unit 222 is grounded, so as to form a loop. When the light emitting unit selection line 282 is at low voltage, the transistor 291 and the transistor 293 are turned off, and the light emitting unit 222 does not emit light.

On the other hand, when the light sensing unit reset lines 288 is at high voltage, the transistor 294 is turned on, so that the voltage source $V_{DD}$ is input to the N pole of the light sensing unit 232, so as to form reversely biased voltage. In this case, the transistor 295 is also turned on, and the voltage of the voltage source $V_{DD}$ may be input to the transistor 296. When a light emitting unit reset line 288 is at high voltage, the light sensing unit selection lines 286 is also at high voltage, and in this case the transistor 297 is turned on, so that the P pole of the light sensing unit 232 is grounded, so as to form a loop, in this case the transistor 296 is also turned on, and a read end 70 reads an electric signal from the voltage source $V_{DD}$ and is at high voltage. Then, when the light sensing unit reset line 288 is at low voltage while the light sensing unit selection line 286 is still at high voltage, the transistor 294 is turned off. However, when the transistor 294 is just turned off, the N pole of the light sensing unit 232 is still at high potential, so that the read end 70 still reads the voltage from the voltage source $V_{DD}$. However, when the light sensing unit 232 detects light and forms photocurrent flowing from the N pole to the P pole, the voltage of the N pole of the light sensing unit 232 gradually decreases. In this case, the transistor 295 may be regarded as an amplifier for amplifying a voltage signal of the N pole of the light sensing unit 232, and therefore when the voltage of the N pole of the light sensing unit 232 gradually decreases, the voltage read by the read end 70 also gradually decreases. Then, when the light sensing unit selection line is at low voltage, the transistor 296 and the transistor 297 are turned off, and in this case, the voltage of the read end 70 also drops to low voltage.

The stronger the intensity of the light detected by the light sensing unit 232 is, the greater the photocurrent is, so that the faster the voltage of the N pole decreases, and the faster the voltage of the read end 70 decreases. By measuring the rate of the voltage decrease of the read end 70 (such as an absolute value of the decrease slope) or measuring the voltage of the read end 70 occurring just before the light sensing unit selection lines 286 is switched from high voltage to low voltage, the intensity of the detected light may be converted into a voltage signal.

Figure 6:
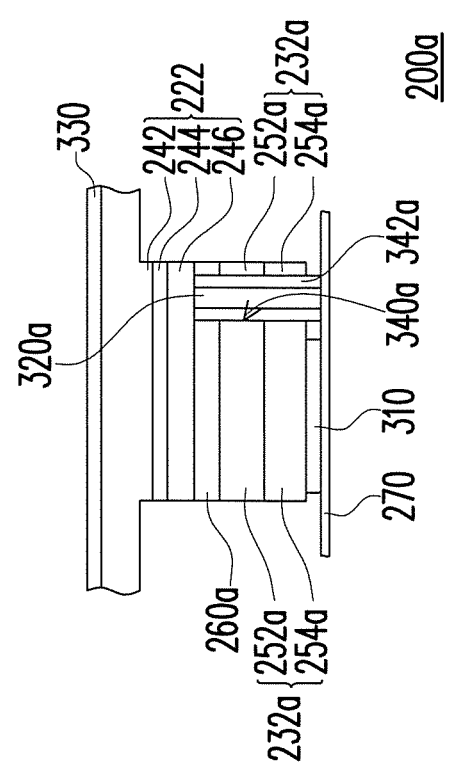
FIG. 6 is a schematic cross-section view of a light emitting unit and a light sensing unit of a light emitting and sensing module according to still another embodiment of the disclosure.

FIG. 6 is a schematic cross-section view of a light emitting unit and a light sensing unit of a light emitting and sensing module according to still another embodiment of the disclosure. Referring to FIG. 6, a light emitting and sensing module 200a of this embodiment is similar to the light emitting and sensing module 200 in FIG. 2B, and the difference between the both is described as follows. In this embodiment, the second electrodes 320a pass through the light sensing units 232a respectively through a plurality of through holes 340a. Specifically, from the second doped semiconductor layer 246, a second electrode 320a sequentially passes through a conductive connection layer 260a, a third doped semiconductor layer 252a and a fourth doped semiconductor layer 254a, wherein an insulation material 342a may be filled between the second electrode 320a and an inner wall of a through hole 340a, so as to achieve insulation effect.

Figure 7:
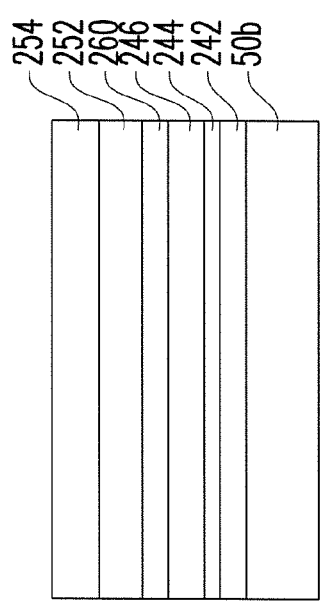
FIG. 7 is a schematic view of epitaxial structure in a process of manufacturing a light emitting and sensing module according to yet another embodiment of the disclosure.
Figure 8:
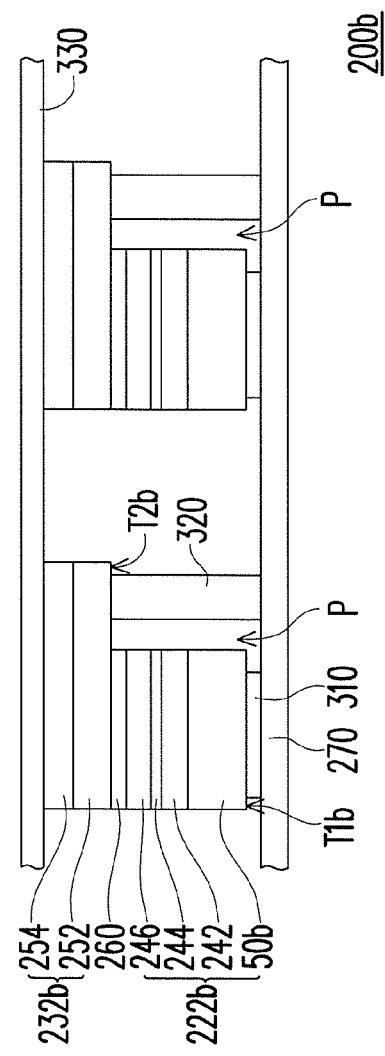
FIG. 8 is a schematic view of a local cross-section of the light emitting and sensing module manufactured from the structure in FIG. 7.

FIG. 7 is a schematic view of epitaxial structure in a process of manufacturing a light emitting and sensing module according to yet another embodiment of the disclosure, and FIG. 8 is a schematic view of a local cross-section of the light emitting and sensing module manufactured from a structure in FIG. 7. Referring to FIG. 7 and FIG. 8, a light emitting and sensing module 200b of this embodiment is similar to the light emitting and sensing module 200 in FIG. 2B, and the difference between the both is described as follows. In this embodiment, a conductive substrate 50b is a semiconductor substrate, such as a doped gallium nitride substrate. In an epitaxial growth process, a first doped semiconductor layer 242, a light emitting layer 244, a second doped semiconductor layer 246, a conductive connection layer 260, a third doped semiconductor layer 252 and a fourth doped semiconductor layer 254 are sequentially grown on the conductive substrate 50b. Afterwards, a mesa area T1b and a step area T2b are formed through etching from the bottom of the foregoing epitaxial structure.

Further, a plurality of first electrodes 310 is respectively connected to the first doped semiconductor layers 242 of the light emitting units 222b of the pixels, and a plurality of second electrodes 320 is respectively connected to the third doped semiconductor layers 252 of the light sensing units 232b of the pixels. Moreover, the electrode layer 330 is formed, and is connected to the fourth doped semiconductor layers 254 of the light sensing units 232b of the pixels. Specifically, each light emitting unit 222b further includes a conductive substrate 50b, which connects a first doped semiconductor layer 242 and a first electrode 310. Moreover, in this embodiment, the second electrodes 320 are located at one side of the light emitting units 222b, respectively.

The light emitting and sensing module 200b shown in FIG. 8 may also adopt a drive circuit similar to that in FIG. 4, and have the advantage and efficacy of the light emitting and sensing module 200 in FIG. 2B, which are not repeated herein.

Figure 9:
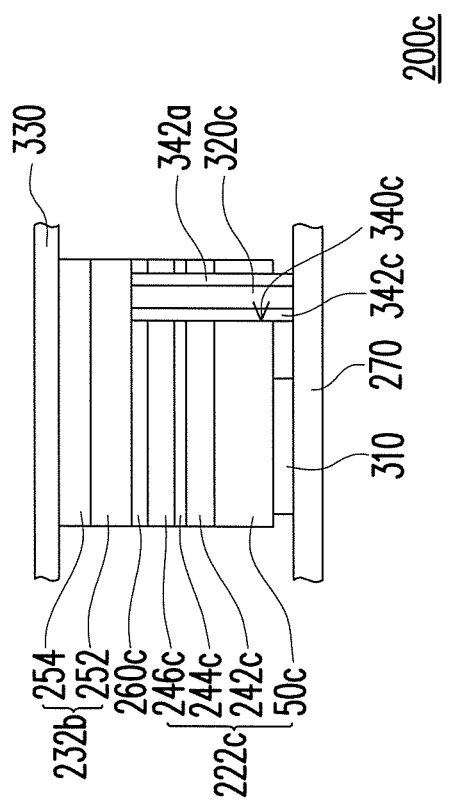
FIG. 9 is a schematic cross-section view of a light emitting and sensing module according to another embodiment of the disclosure.

FIG. 9 is a schematic cross-section view of a light emitting and sensing module according to another embodiment of the disclosure. Referring to FIG. 9, a light emitting and sensing module 200c of this embodiment is similar to the light emitting and sensing module 200b in FIG. 8, and the difference between the both is described as follows. In this embodiment, the second electrodes 320c pass through the light emitting units 222c respectively through a plurality of through holes 340c. Specifically, from a third doped semiconductor layer 252, a second electrode 320c sequentially passes through a conductive connection layer 260c, a second doped semiconductor layer 246c, a light emitting layer 244c, a first doped semiconductor layer 242c and a conductive substrate 50c, wherein an insulation material 342a may be filled between the second electrode 320c and an inner wall of a through hole 340c, so as to achieve insulation effect.

Figure 10:
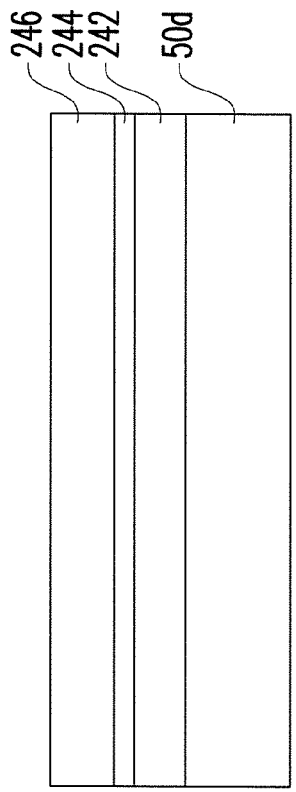
FIG. 10 is a schematic view of epitaxial structure in a process of manufacturing a light emitting and sensing module according to still another embodiment of the disclosure.
Figure 11:
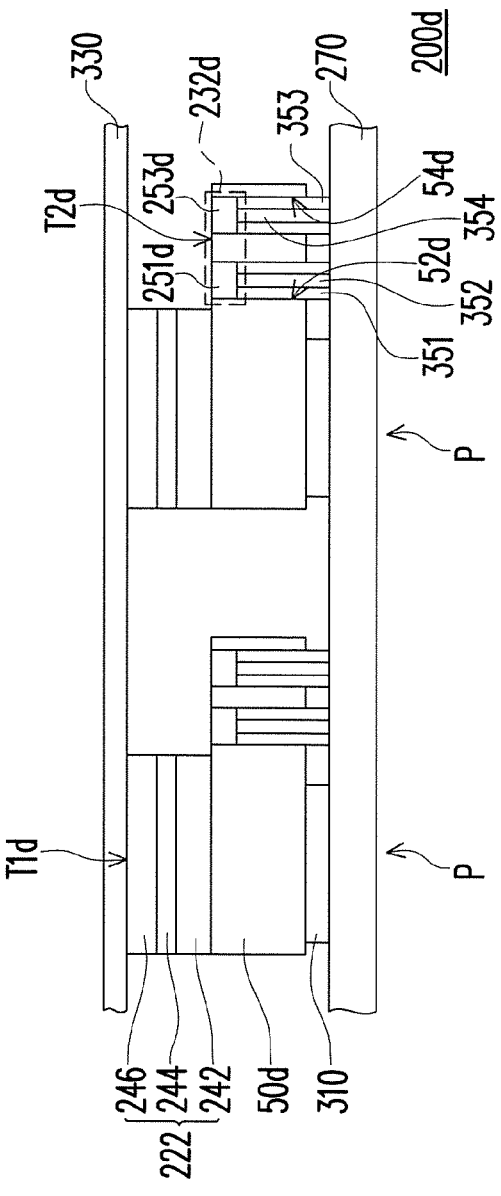
FIG. 11 is a schematic view of a local cross-section of the light emitting and sensing module manufactured from the structure in FIG. 10.

FIG. 10 is a schematic view of epitaxial structure in a process of manufacturing a light emitting and sensing module according to still another embodiment of the disclosure, and FIG. 11 is a schematic view of a local cross-section of the light emitting and sensing module manufactured from a structure in FIG. 10. Referring to FIG. 10 and FIG. 11, a light emitting and sensing module 200d of this embodiment is similar to the light emitting and sensing module 200b in FIG. 8, and the difference between the both is described as follows. In the light emitting and sensing module 200d of this embodiment, the light emitting unit array and the light sensing unit array are alternately disposed. In other words, in a pixel P, the light sensing unit 232d is located at one side of the light emitting unit 222, and the light sensing unit 232d and the light emitting unit 222 are not stacked with each other. In this embodiment, the light sensing unit 232d and the light emitting unit 222 both are disposed on the circuit substrate 270.

Specifically, each pixel P further includes a silicon substrate 50d, and the light sensing unit 232d and the light emitting unit 222 of the pixel P both are disposed on the silicon substrate 50d. In this embodiment, the first doped semiconductor layer 242, the light emitting layer 244 and the second doped semiconductor layer 246 of the light emitting unit 222 are stacked on the silicon substrate 50d, and the light sensing unit 232d is formed on a surface of the silicon substrate 50d. In this embodiment, the silicon substrate 50d is, for example, a silicon substrate which is doped and conductive, that is, a conductive substrate. However, in other embodiments, other types of conductive substrates may also be adopted to replace the silicon substrate 50d. The light sensing unit 232d includes a Schottky contact 251d and an ohmic contact 253d. When light is irradiated to the light sensing unit 232d, the part of the silicon substrate 50d located between the Schottky contact 251d and the ohmic contact 253d generates photocurrent. In this embodiment, each pixel P further includes a third electrode 352 and a fourth electrode 354, wherein the third electrode 352 extends from the circuit substrate 270 to the Schottky contact 251d through a through hole 52d, so as to electrically connect the Schottky contact 251d and the circuit substrate 270. Moreover, the fourth electrode 354 extends from the circuit substrate 270 to the ohmic contact 253d through the through hole 54d, so as to electrically connect the ohmic contact 253d and the circuit substrate 270. An insulation material 351 may be filled between the third electrode 352 and the inner wall of the through hole 52d, so as to achieve insulation effect. Moreover, an insulation material 353 may be filled between the fourth electrode 354 and the through hole 54d, so as to achieve insulation effect.

In the manufacturing process of the light emitting and sensing module 200d, the first doped semiconductor layer 242, the light emitting layer 244 and the second doped semiconductor layer 246 are sequentially grown on the silicon substrate 50d. Afterwards, a mesa area T1d and a step area T2d are formed through etching from the top of the stacked structure, and are bonded onto the circuit substrate 270.

Moreover, the electrode layer 330 is disposed on the second doped semiconductor layers 246 of the pixels P, so as to be electrically connected to the second doped semiconductor layers 246. Moreover, the first electrode 310 is disposed between the silicon substrate 50d and the circuit substrate 270, so as to electrically connect the both. Compared with the case that each pixel P of the light emitting and sensing module 200b in FIG. 8 is driven through three electrodes of the first electrode 310, the second electrode 320 and the electrode layer 330, the light emitting and sensing module 200d of this embodiment is driven through four electrodes of the first electrode 310, the electrode layer 330, the third electrode 352 and the fourth electrode 354.

Figure 12:
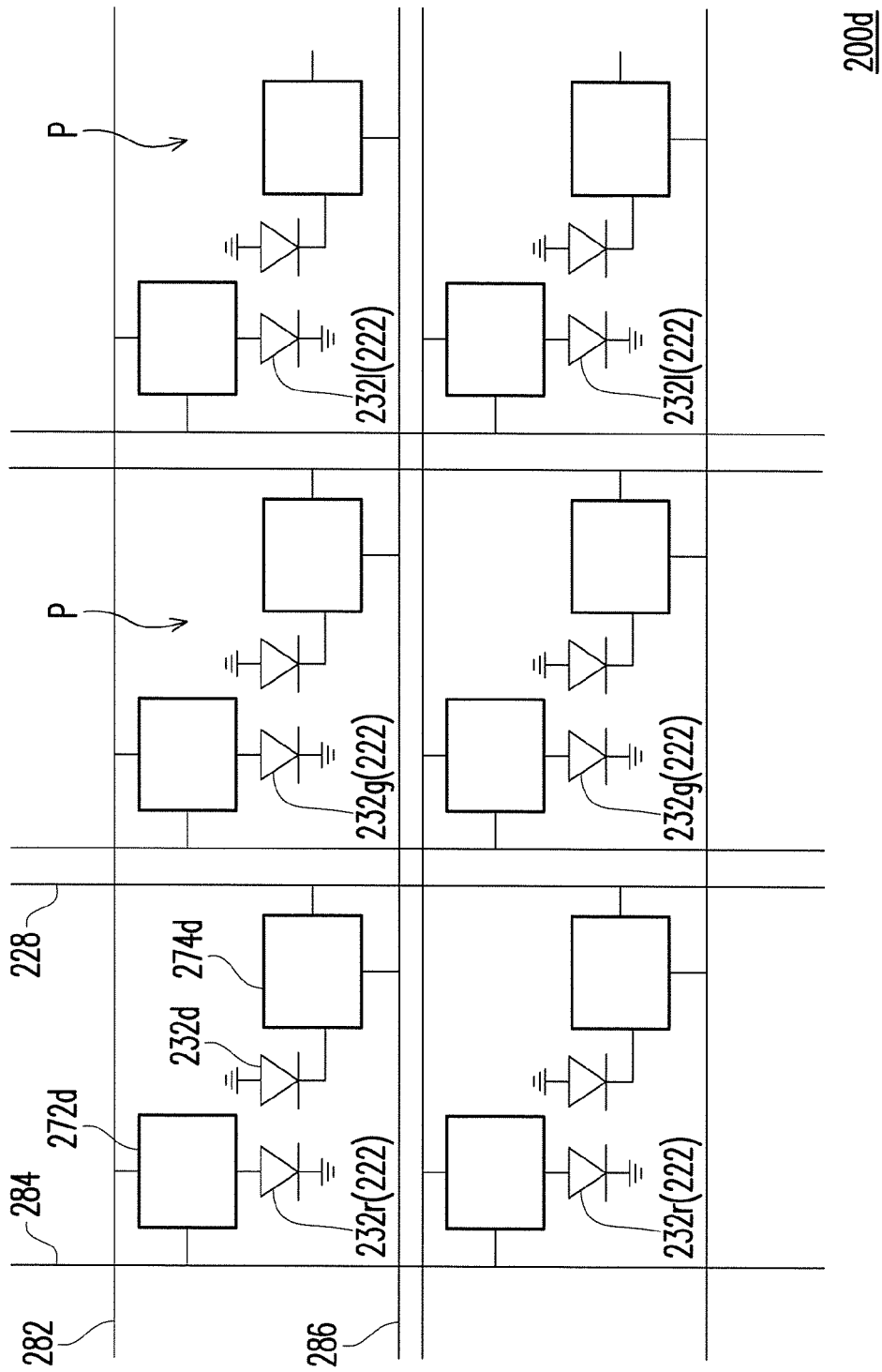
FIG. 12 is a drive block view of the light emitting and sensing module in FIG. 11.
Figure 13:
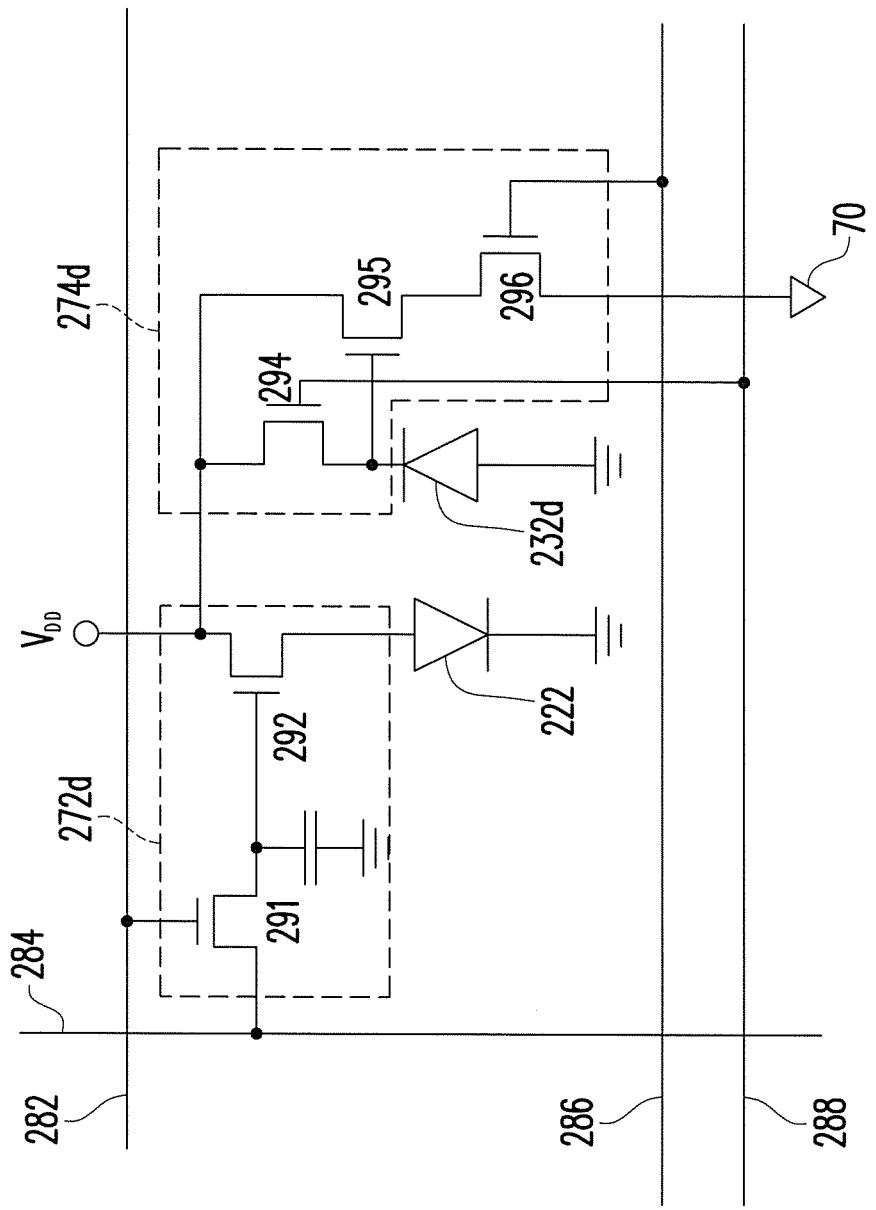
FIG. 13 is a drive circuit diagram of a pixel of the light emitting and sensing module in FIG. 11.
Figure 14:
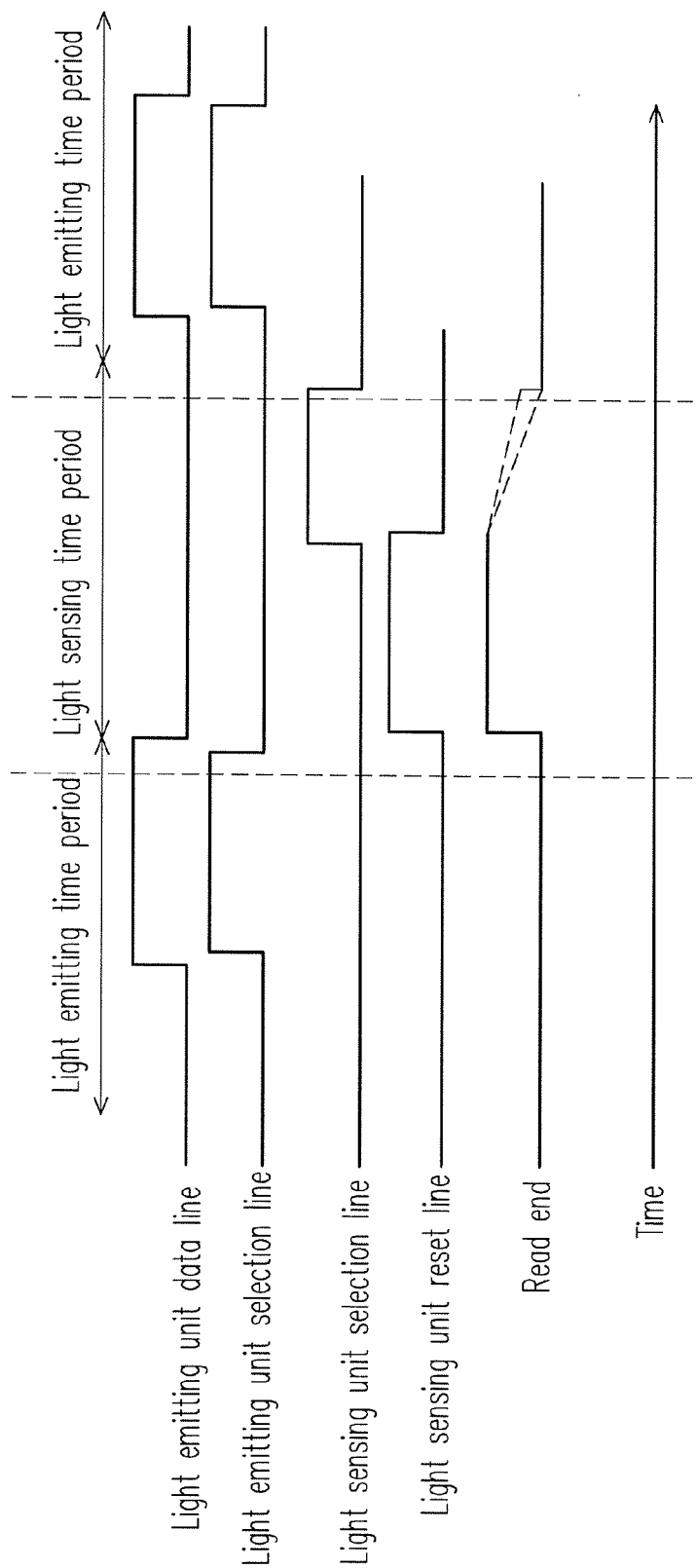
FIG. 14 is a drive oscillogram of the light emitting and sensing module in FIG. 11.

FIG. 12 is a drive block view of the light emitting and sensing module in FIG. 11, FIG. 13 is a drive circuit diagram of a pixel of the light emitting and sensing module in FIG. 11, and FIG. 14 is a drive oscillogram of the light emitting and sensing module in FIG. 11. Referring to FIG. 12 to FIG. 14, the drive block view of FIG. 12 is similar to the drive block view of FIG. 3, and the difference between the both lies in that the drive block view of FIG. 12 can conform to the manner in which the light emitting and sensing module 200d of FIG. 11 is driven through four electrodes. In other words, the light emitting unit drive circuit 272d and the light sensing unit drive circuit 274d drive the light emitting unit 222 and the light sensing unit 232d, respectively. In this embodiment, three adjacent light emitting units 222 are, for example, a red light emitting unit 222r, a green light emitting unit 222g and a blue light emitting unit 222l respectively, so that the light emitting and sensing module 200d is capable of performing full color display.

The drive circuit diagram of FIG. 13 is similar to the drive circuit diagram of FIG. 4, and the difference between the both is described as follows. The drive circuit diagram of FIG. 13 is simplified, the number of transistors used by the drive circuit is small, and the light emitting unit 222 and the light sensing unit 232d are connected in parallel. Referring to FIG. 13 and FIG. 14 together, when a light emitting unit selection line 282 is at high voltage, a transistor 291 is turned on, and in this case, voltage of a light emitting unit data line 284 may be input to a gate of a transistor 292, so as to adjust energy input by a voltage source $V_{DD}$ to a light emitting unit 222 in the pixel P, so that the light emitting unit 222 emits light. When the light emitting unit selection line 282 is at low voltage, the transistor 291 is turned off, and the light emitting unit 222 does not emit light.

On the other hand, when the light sensing unit reset lines 288 is at high voltage, the transistor 294 is turned on, so that the voltage source $V_{DD}$ is input to the N pole of the light sensing unit 232d, so as to form reversely biased voltage. In this case, the transistor 295 is also turned on, and the voltage of the voltage source $V_{DD}$ may be input to the transistor 296. When a light emitting unit reset line 288 is at high voltage, the light sensing unit selection line 286 is also at high voltage, and in this case the read end 70 reads an electric signal from the voltage source $V_{DD}$ and is at high voltage. Then, when the light sensing unit reset line 288 is at low voltage while the light sensing unit selection line 286 is still at high voltage, the transistor 294 is turned off. However, when the transistor 294 is just turned off, the N pole of the light sensing unit 232d is still at high potential, so that the read end 70 still reads the voltage from the voltage source $V_{DD}$. However, when the light sensing unit 232d detects light and forms photocurrent flowing from the N pole to the P pole, the voltage of the N pole of the light sensing unit 232d gradually decreases. In this case, the transistor 295 may be regarded as an amplifier for amplifying a voltage signal of the N pole of the light sensing unit 232d, and therefore when the voltage of the N pole of the light sensing unit 232d gradually decreases, the voltage read by the read end 70 also gradually decreases. Then, when the light sensing unit selection line 286 is at low voltage, the transistor 296 is turned off, and in this case, the voltage of the read end 70 also drops to low voltage.

The stronger the intensity of the light detected by the light sensing unit 232d is, the greater the photocurrent is, so that the faster the voltage of the N pole decreases, and the faster the voltage of the read end 70 decreases. By measuring the rate of the voltage decrease of the read end 70 (such as an absolute value of the decrease slope) or measuring the voltage of the read end 70 occurring just before the light sensing unit selection lines 286 is switched from high voltage to low voltage, the intensity of the detected light may be converted into a voltage signal.

The time during which at least one of the light emitting unit data line 284 and the light emitting unit selection line 282 is at high voltage may be regarded as falling within a light emitting time period, and the time during which at least one of the light sensing unit selection line 286 and the light sensing unit reset line 288 is at high voltage may be regarded as falling within a light sensing time period. In this embodiment, the light emitting time period and the light sensing time period alternately occur, so that photography and projection apparatus adopting the light emitting and sensing module 200d of this embodiment is capable of achieving projection and photography efficacy simultaneously. Moreover, in addition to shooting a static picture, a photography and projection apparatus adopting the light emitting and sensing module 200d of this embodiment or a photography and projection apparatus of other embodiments may also shoot a dynamic movie or short film.

Figure 15:
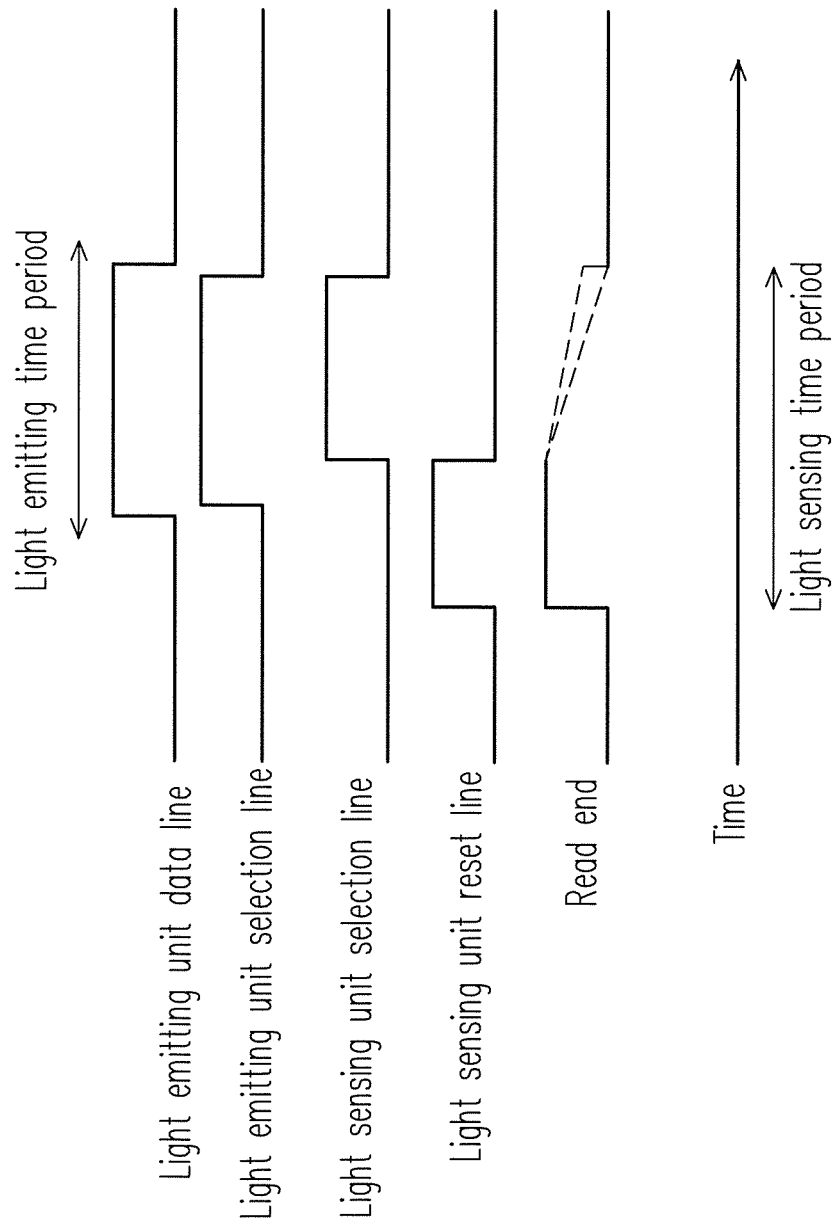
FIG. 15 is another drive oscillogram of a drive circuit in FIG. 13.

FIG. 15 is another drive oscillogram of a drive circuit in FIG. 13. The drive oscillogram of FIG. 15 is similar to the drive oscillogram of FIG. 14, and the difference between the both lies in that in the drive waveform of FIG. 15, the light emitting time period is overlapped with the light sensing time. In other words, when the light emitting unit 222 is emitting light, the light sensing unit 232d is detecting light. In this way, the light sensing unit 232d is capable of detecting color and light intensity emitted by the light emitting unit 222 in real time, so as to adjust the drive energy of the light emitting unit 222 in real time, thereby adjusting and correcting the display color or display brightness of the light emitting and sensing module 200d.

Referring to FIG. 12 again, in another embodiment, a control unit (such as the control unit 120 shown in FIG. 1) is adapted to drive the light emitting units 222 of a first part of the pixels P to emit light (such as drive light emitting units 222 of pixels P at odd rows to emit light) in a time period, and drive the light sensing units 232d of a second part of the pixels P to detect light (such as drive light sensing units 232d of pixels P at even rows to detect light) simultaneously, wherein the first part of the pixels P is respectively adjacent to the second part of the pixels P (such as the pixels P at the odd rows are adjacent to the pixels P at the even rows respectively). In this way, the light sensing unit 232d in a pixel P is capable of detecting light emitted by the light emitting unit 222 of another adjacent pixel, and performing real-time adjustment and correction accordingly. Moreover, in a next time period, the light sensing units 232d of the first part of the pixels P may be driven to detect light, and the light emitting units 222 of the second part of the pixels P may be driven to emit light.

Figure 16A:
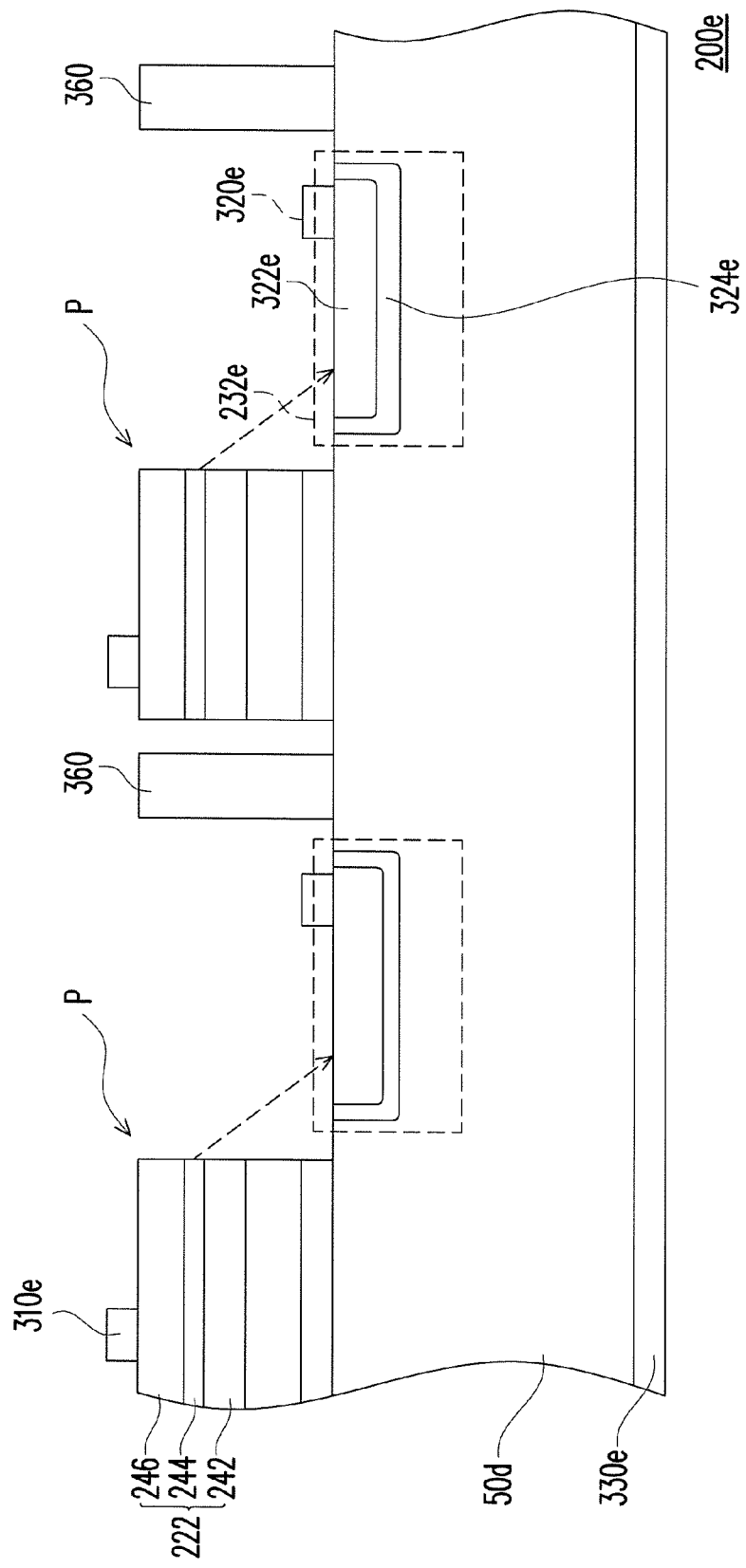
FIG. 16A is a schematic view of a local cross-section of a light emitting and sensing module according to yet another embodiment of the disclosure.

FIG. 16A is a schematic view of a local cross-section of a light emitting and sensing module according to yet another embodiment of the disclosure. Referring to FIG. 16A, a light emitting and sensing module 200e of this embodiment is similar to the light emitting and sensing module 200d in FIG. 11, and the difference between the both is described as follows. In this embodiment, a light sensing unit 232e is a positive-intrinsic-negative (PIN) photodiode, but the light sensing unit 232d of FIG. 11 is a Schottky sensor. In this embodiment, a electrode layer 330e is disposed on a surface of a silicon substrate 50d, and is electrically connected to the silicon substrate 50d and a circuit substrate (as shown in FIG. 11, and not shown in FIG. 16A anymore). In this embodiment, silicon substrates 50d of adjacent pixels P are connected to each other. Moreover, a first electrode 310e is formed on a second doped semiconductor layer 246 of a light emitting unit 222, so as to electrically connect the second doped semiconductor layer 246 and the circuit substrate.

In this embodiment, the light sensing unit 232e is achieved by forming a P-type doped well area 322e and a depletion area 324e on an N-type doped silicon substrate 50d, such as form a P-type doped well area 322e on the silicon substrate 50d with ion implantation. Moreover, a second electrode 320e is disposed on the P-type doped well area 322e, so as to electrically connect the P-type doped well area 322e and the circuit substrate. When light is received in the depletion area 234e, a carrier may be generated, thereby generating photocurrent to be detected and analyzed. In other embodiments, the P-type doped well area 322e may also be replaced with the N-type doped well area, and the N-type doped silicon substrate 50d is replaced with the P-type doped silicon substrate, that is, the doping state of the doped well area is opposite to that of the silicon substrate.

In this embodiment, a light isolation structure 360 is disposed between two adjacent pixels, so as to prevent light emitted by a light emitting unit 222 in a pixel P from being detected by a light sensing unit 232e in an adjacent pixel P. The light isolation structure 360 is, for example, a black light absorption structure, but the disclosure is not limited thereto. In this way, a light sensing unit 232e in a pixel P only detects light emitted by the light emitting unit 222 in the same pixel, and does not detect light emitted by the light emitting unit 222 in another adjacent pixel, thereby improving precision of adjustment and correction of color and brightness.

Figure 16B:
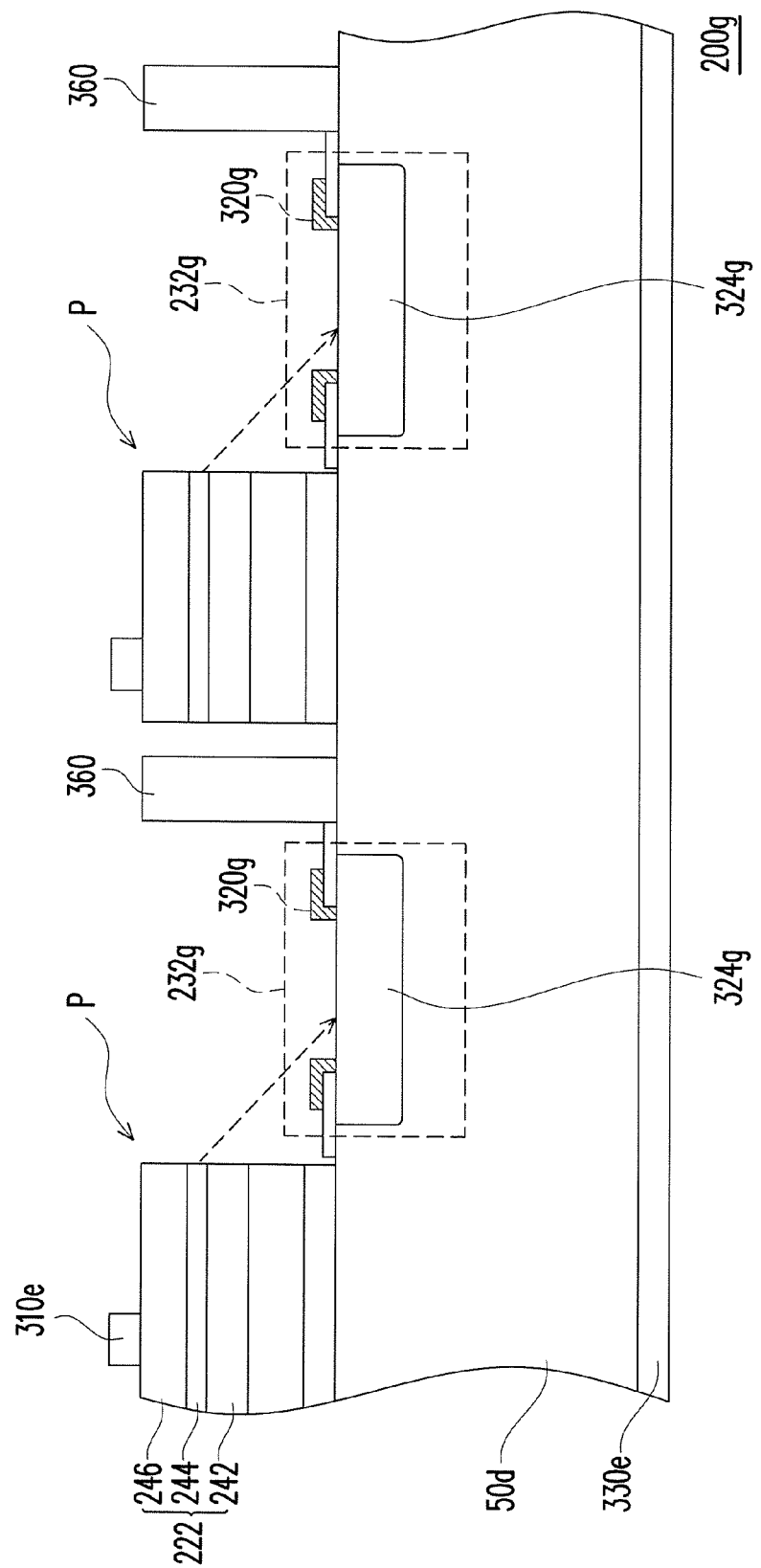
FIG. 16B is a schematic view of a local cross-section of a light emitting and sensing module according to another embodiment of the disclosure.

FIG. 16B is a schematic view of a local cross-section of a light emitting and sensing module according to another embodiment of the disclosure. Referring to FIG. 16B, a light emitting and sensing module 200g of this embodiment is similar to the light emitting and sensing module 200e in FIG. 16A, and the difference between the both is described as follows. in the light emitting and sensing module 200g of this embodiment, the light sensing unit 232g is achieved by forming a depletion area 324g on an N-type doped silicon substrate 50d, and a second electrode 320g is disposed on the depletion area 324g and contacts the depletion area 324g. In other words, the light sensing unit 232g is a Schottky sensor. When light is received in the depletion area 234g, a carrier may be generated, thereby generating photocurrent to be detected and analyzed. In this embodiment, the second electrode 320g is, for example, an annular electrode, but the disclosure is not limited thereto. In other embodiments, the second electrode 320g may also be an electrode in other shapes.

Figure 17:
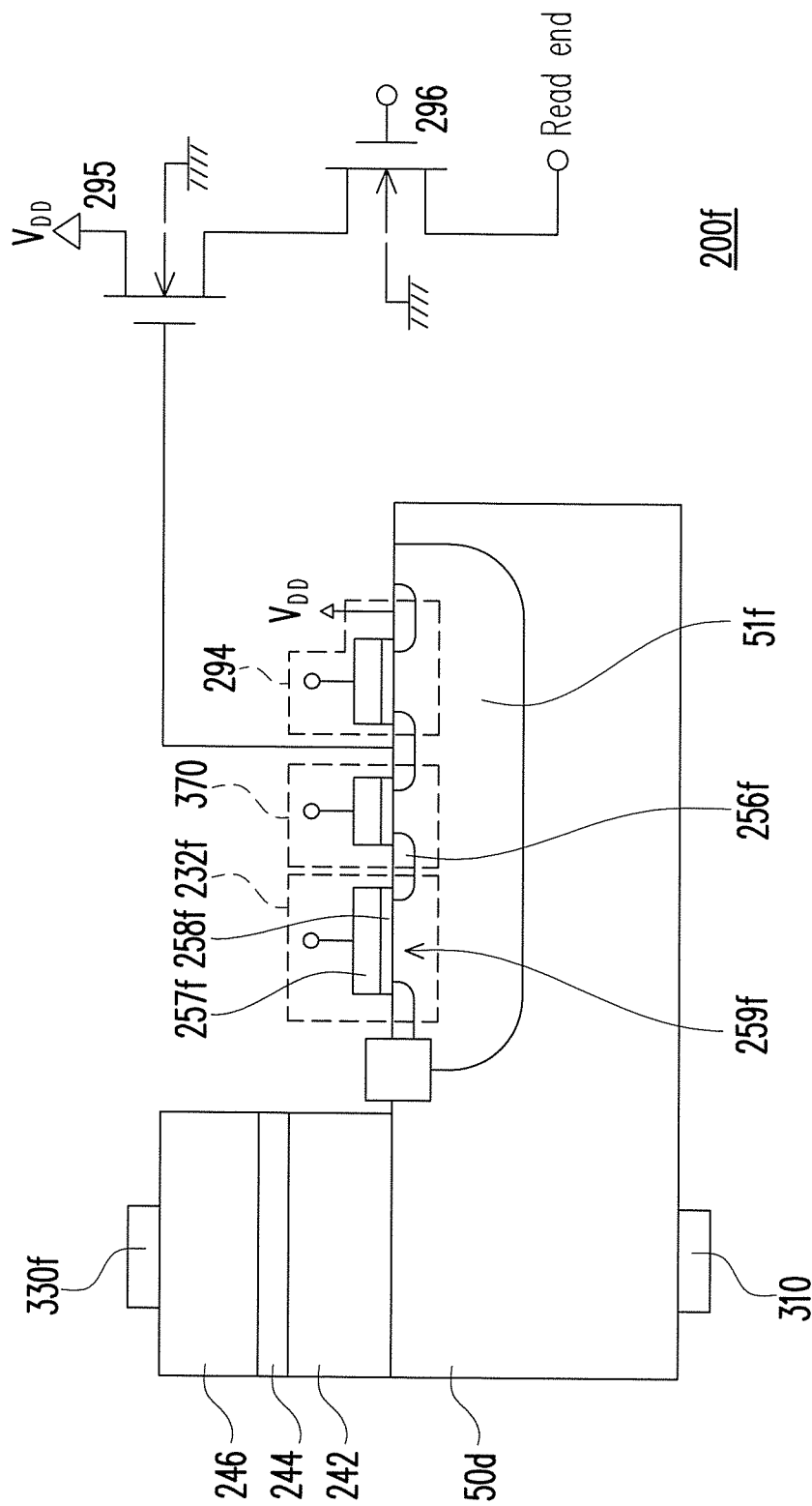
FIG. 17 is a schematic view of a pixel of a light emitting and sensing module according to yet another embodiment of the disclosure.

FIG. 17 is a schematic view of a pixel of a light emitting and sensing module according to yet another embodiment of the disclosure. Referring to FIG. 17, a light emitting and sensing module 200f of this embodiment is similar to the light emitting and sensing module 200d in FIG. 11, and the difference between the both is described as follows. In this embodiment, the light sensing unit 232f is a field effect transistor. The light sensing unit 232f is disposed on a P-type doped well area 51f of a silicon substrate 50d. The light sensing unit 232f includes an N-type doped well area 256f, a gate 257f and an insulation layer 258f, wherein the insulation layer 258f is disposed on the P-type doped well area 51f and is adjacent to the N-type doped well area 256f. When proper voltage is applied to the gate 257f, a depletion area 259f is generated below the gate 257f, and when light is irradiated to the light sensing unit 232f, the depletion area 259f generates photocurrent, so as to convert a light signal into an electric signal, thereby achieving light detection effect. A transistor 370 is a transmitting transistor, configured to transmit the photoelectric carrier generated in the depletion area 259f to an external signal to be read. A transistor 294 is a reset transistor, configured to reset an image sensing state. Transistors 295 and 296 on the right of FIG. 17 and circuits thereof are the same as those of the transistors 295 and 296 shown in FIG. 13, and are not repeated herein. Moreover, the transistors 295 and 296 of FIG. 17 may be disposed in a circuit substrate. However, in this embodiment, a part of a circuit disposed in the circuit substrate may be changed to be disposed on the silicon substrate 50d, as shown in FIG. 17, and the transistor 294 of FIG. 13 is disposed on the P-type doped well area 51f on the silicon substrate 50d. In an embodiment, a charge coupled device (CCD) or complementary metal oxide semiconductor sensor (CMOS sensor) may be manufactured on the silicon substrate 50d, so as to detect light.

Figures 18A, 18B:
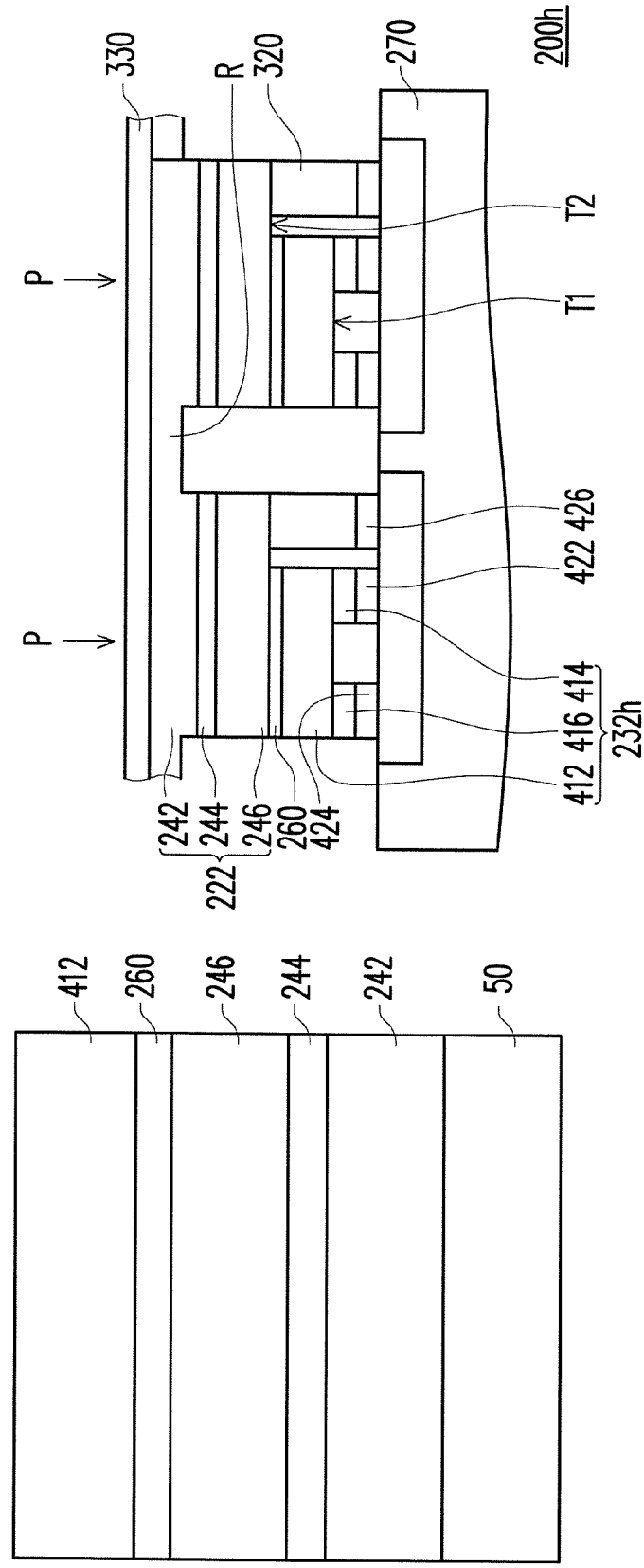
FIG. 18A is a schematic view of epitaxial structure in a process of manufacturing a light emitting and sensing module according to another embodiment of the disclosure.
FIG. 18B is a schematic view of a local cross-section of the light emitting and sensing module manufactured from the structure in FIG. 18A.

FIG. 18A is a schematic view of epitaxial structure in a process of manufacturing a light emitting and sensing module according to another embodiment of the disclosure, and FIG. 18B is a schematic view of a local cross-section of the light emitting and sensing module manufactured from the structure in FIG. 18A. Referring to FIGS. 18A and 18B, a light emitting and sensing module 200h of this embodiment is similar to the light emitting and sensing module 200 in FIG. 2B, and the difference between the both is as follows. In the light emitting and sensing module 200h of this embodiment, a light sensing unit 232h includes a fifth doped semiconductor layer 412 and Schottky contacts 414 and 416, wherein the fifth doped semiconductor layer 412 is connected to the light emitting unit 222 through the conductive connection layer 260, e.g. being connected to the second doped semiconductor layer 246 of the light emitting unit 222. In addition, the Schottky contacts 414 and 416 are spaced from each other and disposed on a side of the fifth doped semiconductor layer 412 facing away from the light emitting unit 222. The junction between the Schottky contact 414 and the fifth doped semiconductor layer 412 is a Schottky junction, and the junction between the Schottky contact 416 and the fifth doped semiconductor layer 412 is also a Schottky junction, so that the fifth doped semiconductor layer 412 and the Schottky contacts 414 and 416 form a metal-semiconductor-metal Schottky photodiode, which achieves the function of light sensing. In this embodiment, the fifth doped semiconductor layer 412 is, for example, an n-type semiconductor layer. However, in other embodiments, the fifth doped semiconductor layer 412 may be a p-type semiconductor layer. In this embodiment, the Schottky contact 414 may be electrically connected to the circuit substrate 270 through a bump 422, and the Schottky contact 416 may be electrically connected to the circuit substrate 270 through a bump 424.

Reference may be made to FIG. 18A for the manufacturing process of the light emitting unit 222 and the light sensing unit 232h. Firstly, the first doped semiconductor layer 242, the light emitting layer 244, the second doped semiconductor layer 246, the conductive connection layer 260, and the fifth doped semiconductor layer 412 are grown on the substrate 50 in sequence. Next, selective etching is performed on these layers, so that these layers form a mesa area T1 and a step area T2 as shown in FIG. 18B. Afterwards, the entire structure is inverted, and is bonded onto the circuit substrate 270 through the Schottky contact 414, the Schottky contact 416, and the second electrode 320. For example, the Schottky contact 414 is bonded to the circuit substrate 270 through the bump 422, the Schottky contact 416 is bonded to the circuit substrate 270 through the bump 424, and the second electrode 320 is bonded to the circuit substrate 270 through the bump 426. Then, the substrate 50 is removed. Afterwards, the electrode layer 330 is formed on the first doped semiconductor layer 242. In this way, the entire of each light emitting unit 222 and light sensing unit 232h forms a four terminal device, i.e. a device including four electrodes of the Schottky contact 414, the Schottky contact 416, the electrode layer 330, and the second electrode 320.

In other embodiments, the conductive connection layer 260 is not adopted, and the second doped semiconductor layer 246 directly contacts the fifth doped semiconductor layer 412, i.e., the fifth doped semiconductor layer 412 is formed directly on the second doped semiconductor layer 246. Alternatively, in other embodiments, the conductive connection layer 260 may be replaced by a transparent insulating layer. In another embodiment, when the selective etching is performed on these layers, a connecting part R of the first doped semiconductor layer 242 between two adjacent pixels may be etched, so that the first doped semiconductor layers 242 of two adjacent pixels P are not continuous.

Figure 19A:
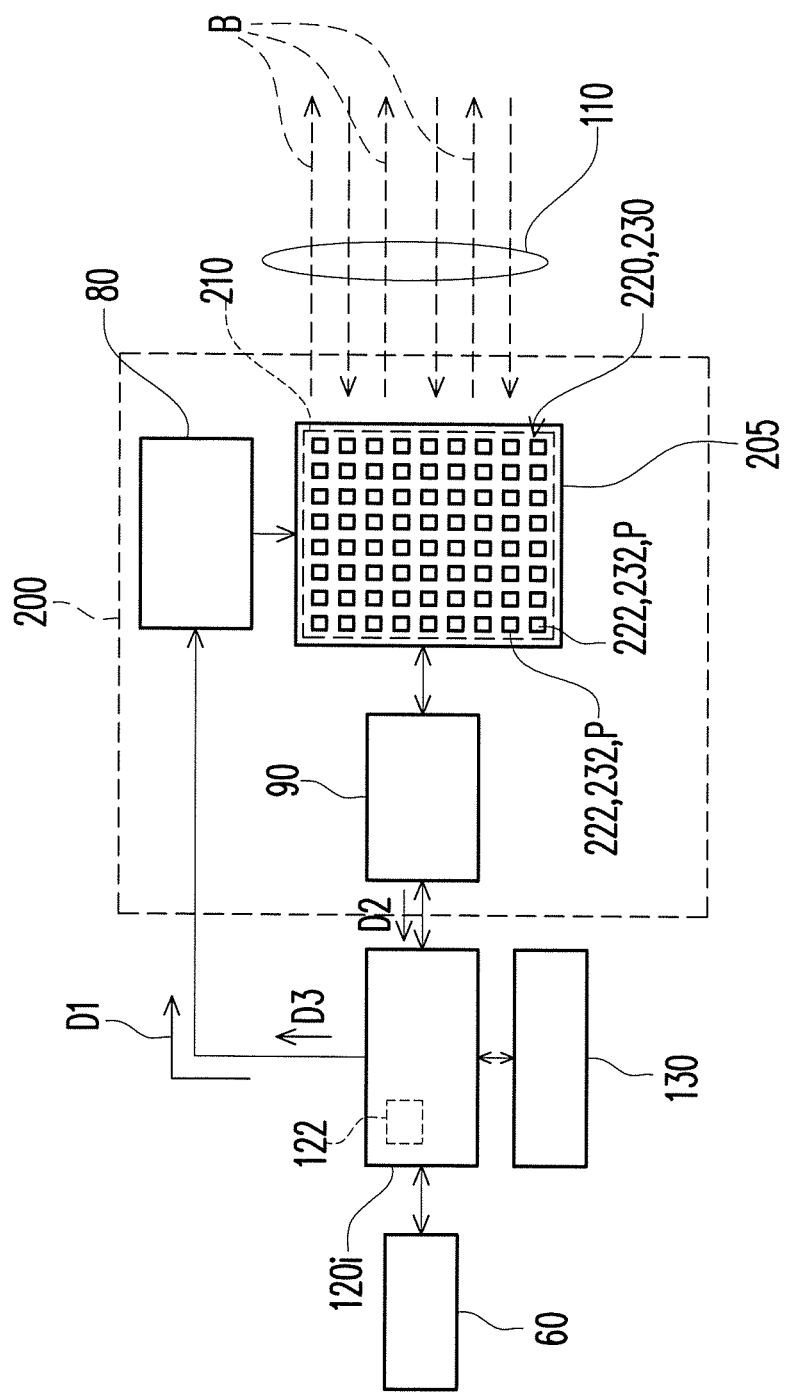
FIG. 19A is a block diagram of a photography and projection apparatus according to still another embodiment of the disclosure.
Figure 19B:
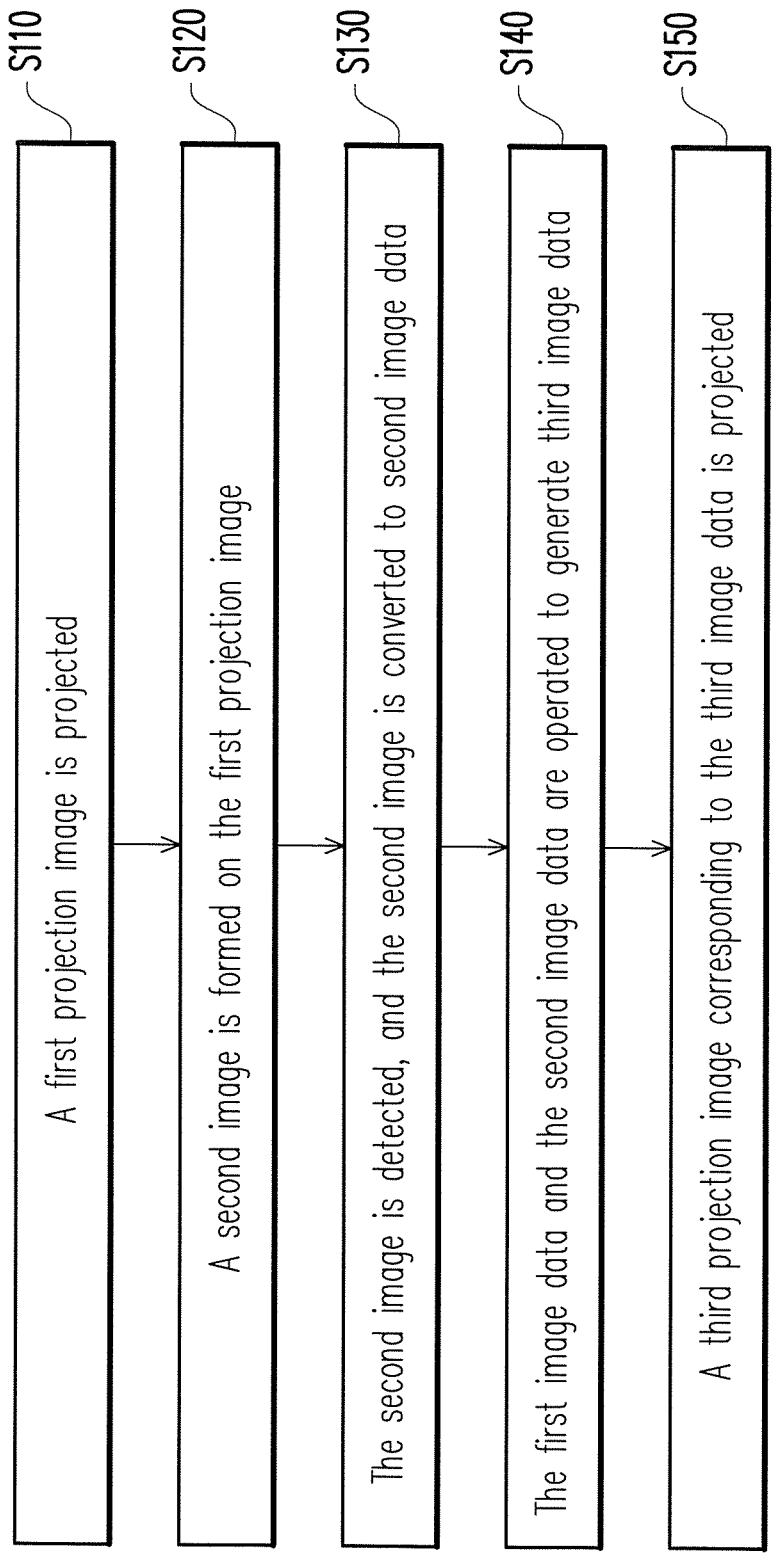
FIG. 19B is a flow chart showing an application method of a photography and projection apparatus in FIG. 19A.

FIG. 19A is a block diagram of a photography and projection apparatus according to still another embodiment of the disclosure, FIG. 19B is a flow chart showing an application method of a photography and projection apparatus in FIG. 19A, and FIGS. 20A to 20D show application methods of a photography and projection apparatus according to an embodiment of the disclosure. Referring to FIGS. 1, 19A, 19B, and 20A first, a photography and projection apparatus 100i in this embodiment is similar to the photography and projection apparatus 100 in FIG. 1, and the difference between the both lies in that a control unit 120i of the photography and projection apparatus 100i in this embodiment includes an operation sub-unit 122. The application method of the photography and projection apparatus 100i in this embodiment includes following steps. First, a step S110 is executed, i.e. a first projection image is projected. Specifically, in this embodiment, first image data D1 is provided to the first driver 80 by the control unit 120i, and the first driver 80 drives the light emitting and sensing device 205 to generate a first image. The projection lens 110 projects the first image onto a screen 40, so as to form the first projection image I1 on the screen 40. Then, a step S120 is executed, i.e. a second image I2 is formed on the first projection image I1. For example, the second image I2 is formed on the first projection image I1 by an external device 30. In this embodiment, the external device 30 is, for example, a laser pointer, and the second image I2 is, for example, an image of a light spot on the screen formed by a laser light emitted from the laser pointer or an image of a moving track of the light spot on the screen 40.

Afterwards, a step S130 is executed, i.e. the second image I2 is detected, and the second image I2 is converted into second image data D2. In this embodiment, the second driver 90 is commanded by the control unit 120i to drive the light sensing array 230 of the light emitting and sensing device 205 to detect the second image I2 and to convert the second image I2 into the second image data D2. Next, the second driver 90 transmits the second image data D2 to the control unit 120i.

Then, a step 140 is executed, i.e. the first image data D1 and the second image data D2 are operated to generate third image data D3. In this embodiment, the first image data D1 and the second image data D2 may be operated by the control unit 120i, e.g. operated by the operation sub-unit 122 of the control unit 120i, so as to generate the third image data D3.

Next, a step 150 is executed, i.e. a third projection image I3 corresponding to the third image data D3 is projected. For example, the third projection image I3 is projected onto the screen 40. In this embodiment, the third image data D3 is provided to the first driver 80 by the control unit 120i, and the first driver 80 drives the light emitting and sensing device 205 to generate the third image. The projection lens 110 projects the third image onto the screen 40 to generate the third projection image I3.

In this embodiment, the first projection image I1 may include an object I11, and the second image I2 is, for example, the track formed by using the laser pointer circling the object I1, e.g. a track similar to a circle. In addition, the third projection image I3 may include a converted image I22 similar to the second image I2, and the converted image I22 is, for example, an image of a geometric figure. For example, the converted image I22 is, for example, an image of a circle. In this embodiment, the third projection image I3 is, for example, an image formed by superimposing the converted image I22 onto the first projection image I1. However, in other embodiments, the third projection image I3 is, for example, an image formed by subtracting the converted image I22 from the first projection image I1, i.e. the converted image I22 on the screen 40 presents the color of background, e.g., black. In this way, drawing on the screen by the external device 30 is achieved.

In addition, in this embodiment, the laser light projected from the external device 30 is, for example, visible light or invisible light, wherein the invisible light is, for example, infrared light.

Figure 20A:
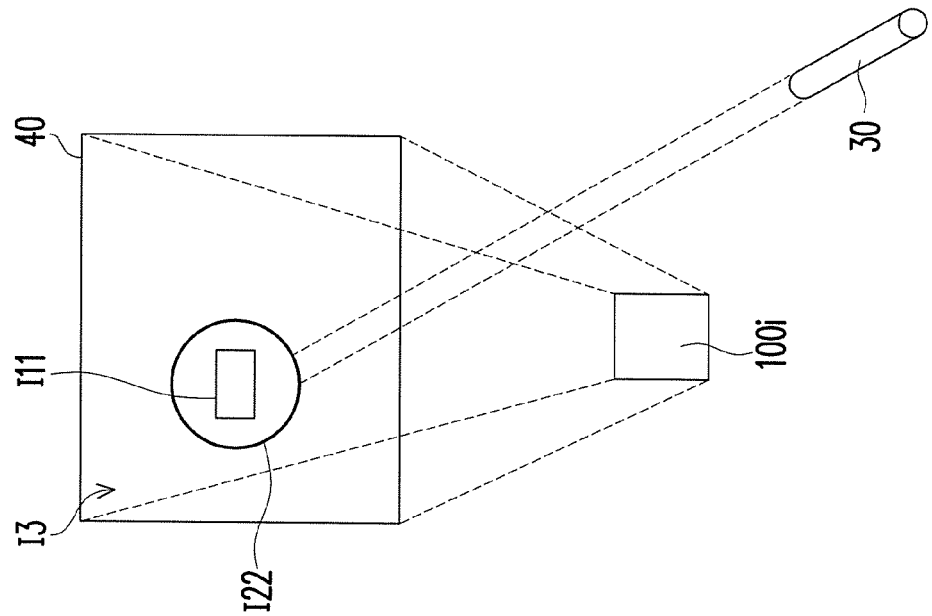
FIGS. 20A to 20D show application methods of a photography and projection apparatus according to an embodiment of the disclosure.
Figure 20A:
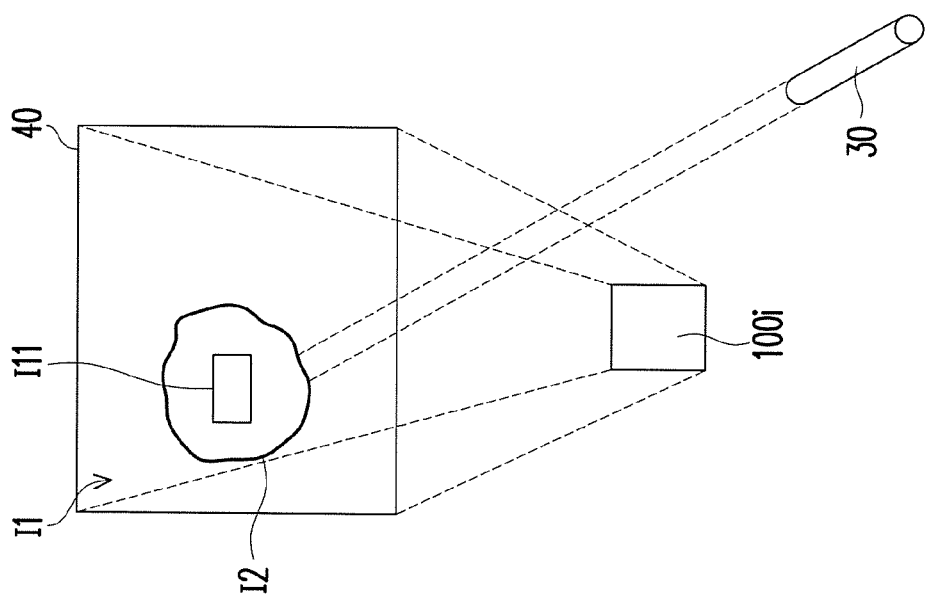
Figure 20B:
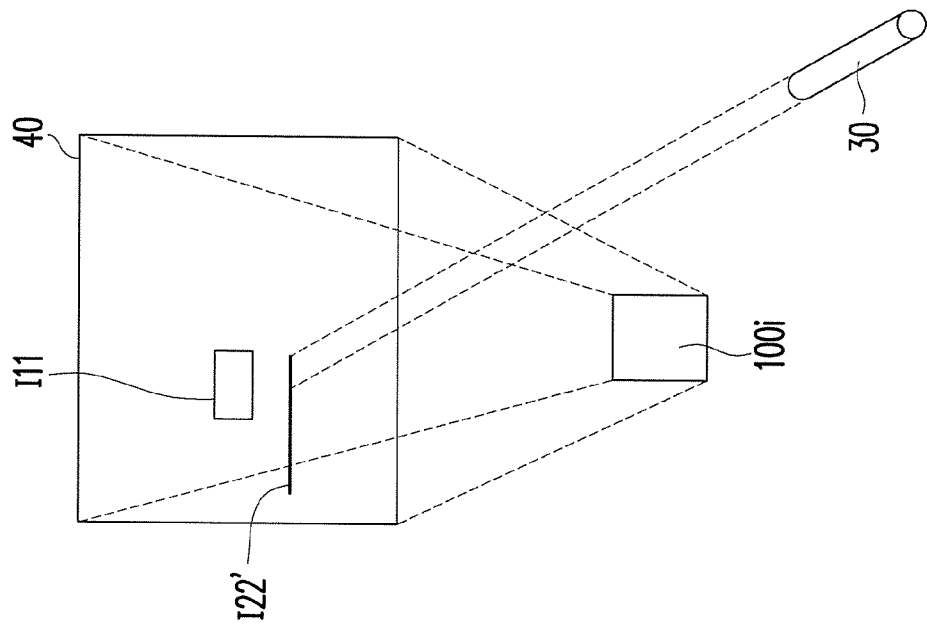
Figure 20B:
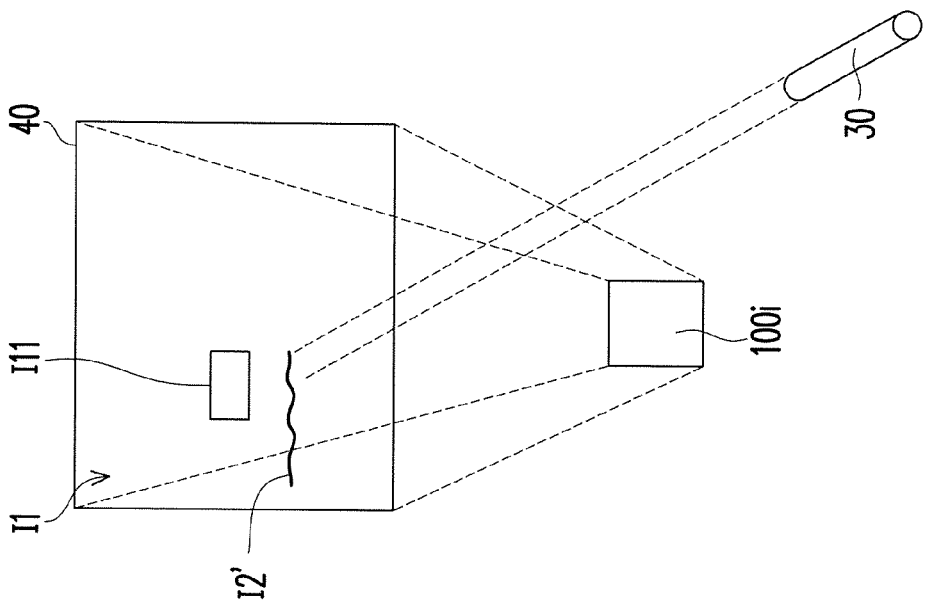

Moreover, in this embodiment, the formation method of the converted image I22 is, for example, that the operation sub-unit 122 compares the second image data D2 with a built-in figure database, and selects a figure most similar to the second image I2 from the built-in figure database to serve as converted image data, and the converted image data is superimposed onto the first image data D1 to generate third image data D3, wherein the converted image data generates the converted image I22 correspondingly. However, in other embodiments, the converted image data may be subtracted from the first image data D1 to generate the third image data D3. For example, the converted image I22 in FIG. 20A is, for example, a circle. Additionally, the second image I2' in FIG. 20B is, for example, a figure similar to a straight line, and the converted image I22' is, for example, a straight line.

Figure 20C:
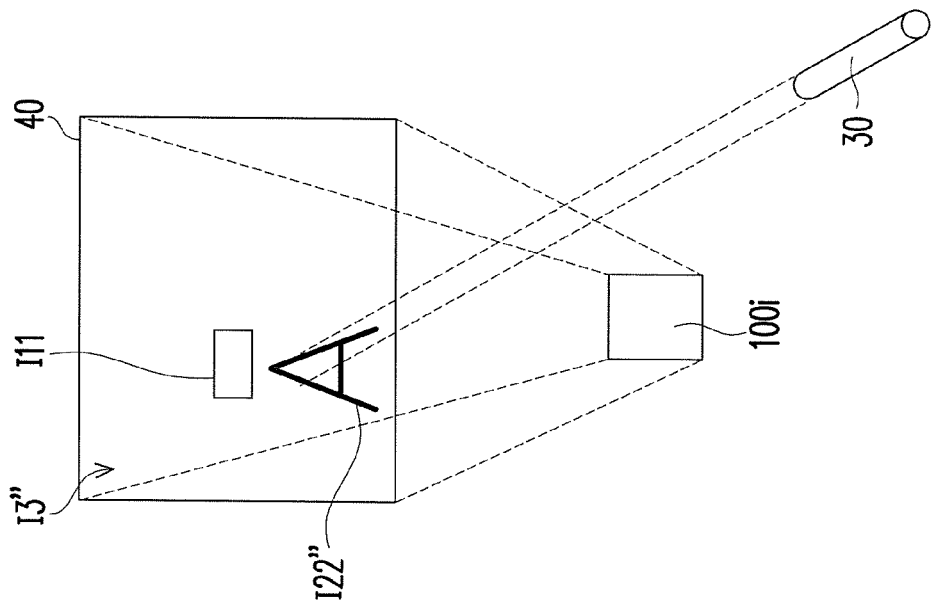
Figure 20C:
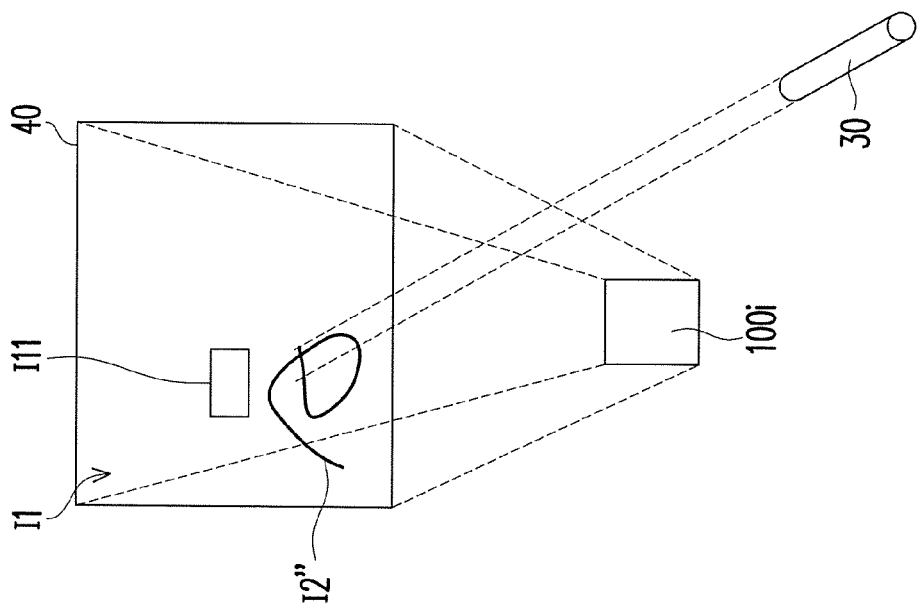
Figure 20D:
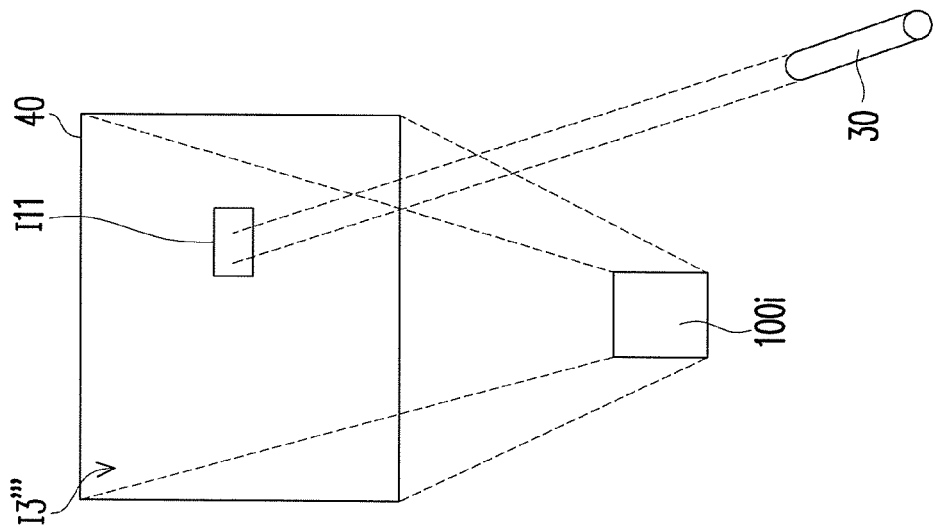
Figure 20D:
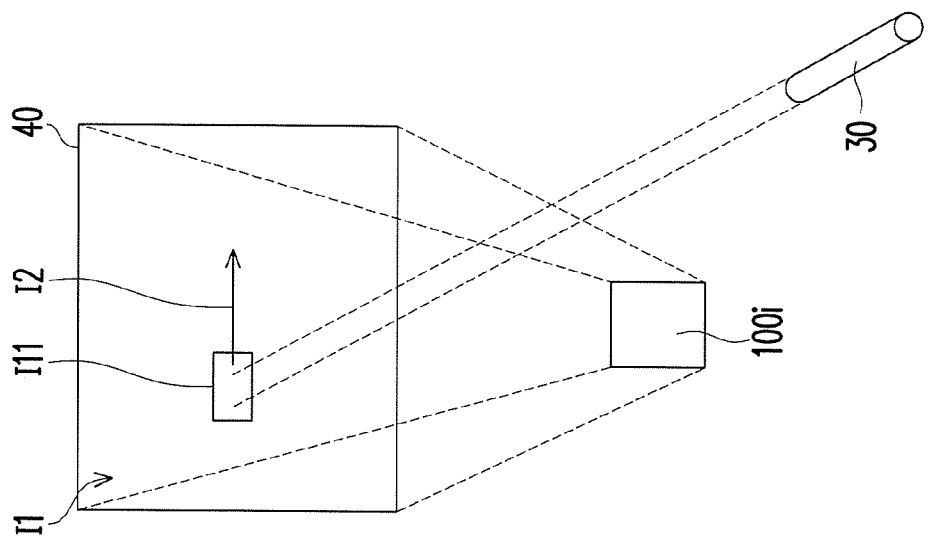

Moreover, referring to FIG. 20C, operation sub-unit 122 can also compare the second image data D2 with a built-in character (or letter) database to select a character (or a letter)

most similar to the second image I2". Then, the control unit 120 superimposes the converted image data representing the character (or letter) onto the first image data D1 to form the third image data D3. In this way, the third projection image I3" including the converted image I22", i.e. a character or letter, is projected onto the screen 40. Alternatively, in other embodiments, the converted image may be subtracted from the first image data D1 to generate the third image data D3.

Referring to FIG. 20D again, in this embodiment, the second image I2 is, for example, a track of light projected by an external device 30, and the object I11 has a corresponding object area, for example, the rectangle in FIG. 20D. Moreover, the operation sub-unit determines whether a least part of the second image I2 is located within the object area or not. That is, whether a least part of the second image I2 is located within the object area or not is determined according to the second image data D2 and the first image data D1. If yes, the control unit 120i turns on the function corresponding to the second image I2 (i.e. the track of light). For example, if the track of light is formed by moving from a start position to a terminal position, and the start position is located within the object area, then the operation sub-unit 122 generates a third image data D3, so as to correspondingly form a third projection image I3''' on the screen 40, wherein the object I11 included by the third projection image I3''' is located at the terminal position. In this way, the object I11 in the first projection image I1 may be moved by the external device 30. In addition, in another embodiment, the function corresponding to the second image I2 may be music or video playing, hyperlink opening, or page change.

As such, when the photography and projection apparatus 100i and the application method thereof are used to a briefing with projection images, interaction with the projection images may be achieved by the external device 30, e.g. the laser pointer, so as to increase the ability of the interaction and effect of the briefing with projection images.

Figure 21:
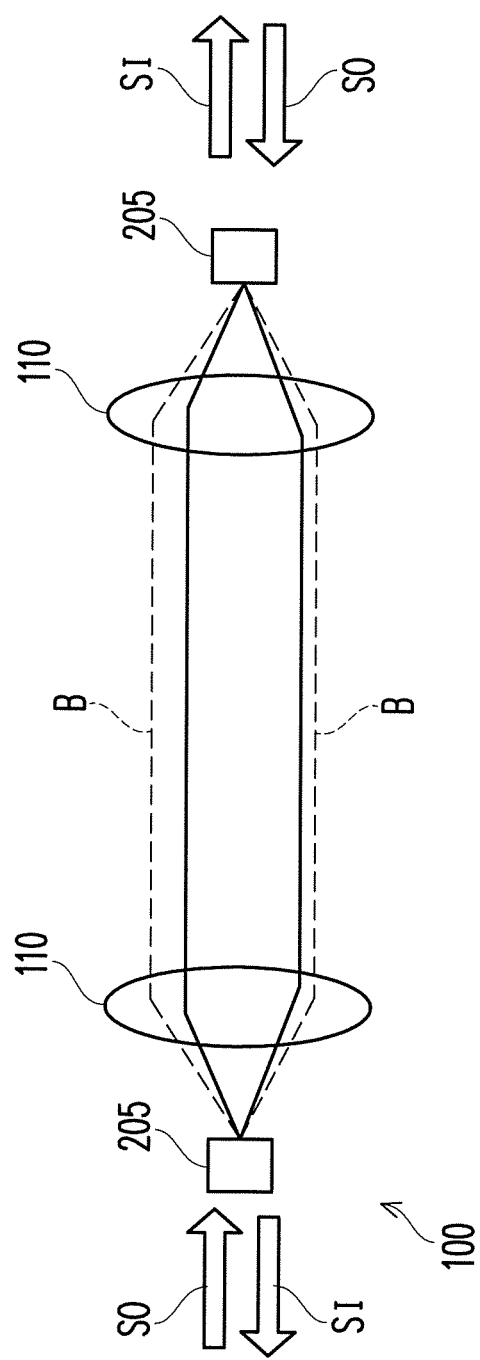
FIG. 21 shows an application of the photography and projection apparatus according to yet another embodiment of the disclosure.

FIG. 21 shows an application of the photography and projection apparatus according to yet another embodiment of the disclosure. Referring to FIG. 21, when a plurality of photography and projection apparatuses 100 are used together, an optical communication system is formed, and each of the photography and projection apparatuses 100 serves as an optical transceiver device. In FIG. 21, two photography and projection apparatuses 100 are taken as an example. As shown in FIG. 21, two photography and projection apparatuses 100 may be disposed to face each other, and the projection lens 110 may be a lens transforming the image beam B from the light emitting and sensing device 205 into a parallel beam. As such, the image beam B generated by one of the two photography and projection apparatuses 100 is capable of being projected parallelly onto the projection lens 110 of the other one of the two photography and projection apparatuses 100, and the projection lens 110 of the other one of the two photography and projection apparatuses 100 forms an image of the image beam B on the light emitting and sensing device 205 of the other one of the two photography and projection apparatuses 100. In other words, when FIG. 21 is taken as an example, when receiving an output signal SO, the left photography and projection apparatus 100 converts the output signal SO into an image beam B. Then, the image beam B is parallelly projected onto the right photography and projection apparatus 100, and the right photography and projection apparatus 100 converts the image beam B into an input signal SI, and the action of optical communication is achieved, wherein the output signal SO and the input signal SI are, for example, electrical signals. On the other hand, when receiving an output signal SO, the right photography and projection apparatus 100 converts the output signal SO into an image beam B, and the projection lens 110 is configured to parallelly project the image beam B onto the left photography and projection apparatus 100. The light emitting and sensing device 205 of the left photography and projection apparatus 100 converts the image beam B into an output signal SO. In this way, the optical communication in another direction is achieved. In other words, the optical communication system in this embodiment achieves bidirectional optical communication.

In another embodiment, one-to-many bidirectional optical communication of one photography and projection apparatus 100 to a plurality of photography and projection apparatuses 100 may also be achieved. For example, the projection lens 110 of the one photography and projection apparatus 100 may cause the image beam B from the light emitting and sensing device 205 to be a divergent light, so that the image beam B is capable of striking the plurality of photography and projection apparatuses 100. As such, one-to-many bidirectional optical communication is achieved. The disclosure does not limit the image beam B transformed by the projection lens 110 to be a parallel beam or a divergent beam. In another embodiment, the transformed image beam B may be a convergent beam.

In this embodiment, since the two photography and projection apparatuses 100 may use the projection lenses 110 thereof to automatically adjust focal lengths and directivity in response to the signals generated from the light sensing unit array 230, so as to ensure optimal quality of optical signals. As a result, free space may be located between the two photography and projection apparatuses 100, and the two photography and projection apparatuses 100 may transmit optical signals without optical fibers. Therefore, signal transmitting channels in free space may be formed between the two photography and projection apparatuses 100. Moreover, since each of the light emitting unit array 220 and the light sensing unit array 230 has a plurality of pixels P, the photography and projection apparatus 100 in this embodiment may achieve a visible light optical communication structure with multiple channels and high speed.

In addition, visible light may be used to transmit signals in this embodiment, so that interference with statutory radio frequency (RF) signals or signals within other bands does not occur, and confidentiality protection of information is achieved. Besides, the image generated by the light emitting unit array 220 and the image received by the light sensing unit array 230 may be hologram images, i.e. the images produced by holography. As a result, the image beam B may transmit huger information.

Moreover, colorization of the pixels P may be achieved through phosphors, quantum dots, nano-phosphors, polymer, organic material, or inorganic material, so that the transmitted optical signals may carry more information, and more information is analyzed by detecting different colors. Moreover, not only is different colors detected and determined, but also different color temperatures and color rendering indices may be detected and determined. Additionally, different colors may be used to transmit signals with different properties. Alternatively, uploaded signals may adopt one color, and downloaded signals may adopt another color, so that double communication is achieved.

Furthermore, a photonic crystal may be formed on the surface of the light emitting unit array 220, and the holes of the photonic crystal go deep into the light emitting layer 244 to generate surface recombination mechanism, thus further increasing the response rate of light emission of the light emitting unit array 220.

Besides, the projection lens 110 of the photography and projection apparatus 100 may be replaced by a lens array disposed on the light emitting unit array 220. Alternatively, the shapes of a grating, the photonic crystal, and the mesa area T1 of the light emitting unit array 220 may be adopted to control the light shape and the transmission direction of the image beam B.

To sum up, because the light emitting and sensing module in the photography and projection apparatus of this embodiment of the disclosure can integrate the light emitting unit array and the light sensing unit array together, the light emitting and sensing module may have small volume, and have both display (or projection display) and light detection functions. Moreover, because the light emitting and sensing module may directly emit an image beam, instead of being like the case that a conventional projection apparatus adopts a light valve to convert an illumination beam generated by an illumination system into an image beam, the photography and projection apparatus of the embodiments of the disclosure may save the space occupied by the light path of the illumination beam in the prior art, thereby effectively shrinking the volume of the photography and projection apparatus of the embodiments of the disclosure. In this way, the photography and projection apparatus of the embodiments of the disclosure is appropriately mounted in a portable electronic apparatus and does not occupy excessive volume, and can further shrink the entire volume of the portable electronic apparatus. Additionally, in the embodiments of the disclosure, the light sensing unit array may also be utilized to detect the light emitted by the light emitting unit array, so as to perform image correction or adjustment (such as color adjustment and correction, or brightness adjustment and correction).

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. A photography and projection apparatus, comprising:
   a light emitting and sensing module having a light emitting and sensing area, the light emitting and sensing module comprising:
      a light emitting unit array, comprising a plurality of light emitting units arranged in an array, wherein the light emitting units are distributed in the light emitting and sensing area and the light emitting unit array is adapted to provide an image beam; and
      a light sensing unit array, comprising a plurality of light sensing units arranged in an array, wherein the light sensing units are distributed in the light emitting and sensing area, and each of the light sensing units and a corresponding one of the light emitting units form a pixel; and
   a projection lens, disposed on a transmission path of the image beam;
   wherein a light isolation structure is disposed between two adjacent pixels, so as to prevent light emitted by a light emitting unit in a pixel from being detected by a light sensing unit in an adjacent pixel, and wherein in each of the pixels, the light isolation structure is not disposed between the light sensing unit and the corresponding light emitting unit.

2. The photography and projection apparatus according to claim 1, wherein each of the light emitting units comprises:
   a first doped semiconductor layer;
   a second doped semiconductor layer; and
   a light emitting layer, disposed between the first doped semiconductor layer and the second doped semiconductor layer, and
   each of the light sensing units comprises:
   a third doped semiconductor layer; and
   a fourth doped semiconductor layer, connected to the third doped semiconductor layer, wherein the light sensing units are stacked with the light emitting units respectively.

3. The photography and projection apparatus according to claim 2, wherein the light emitting and sensing module further comprises:
   a plurality of first electrodes, connected to the fourth doped semiconductor layers of the light sensing units of the pixels respectively;
   a plurality of second electrodes, connected to the second doped semiconductor layers of the light emitting units of the pixels respectively, and electrically connected to the third doped semiconductor layers of the light sensing units; and
   an electrode layer, electrically connected to the first doped semiconductor layers of the light emitting units of the pixels.

4. The photography and projection apparatus according to claim 3, wherein the second electrodes pass through the light sensing units respectively through a plurality of through holes.

5. The photography and projection apparatus according to claim 3, wherein the light emitting and sensing module further comprises:
   a plurality of light emitting unit drive circuits, driving the light emitting units respectively through the second electrodes and the electrode layer; and
   a plurality of light sensing unit drive circuits, driving the light sensing units respectively through the first electrodes and the corresponding second electrodes.

6. The photography and projection apparatus according to claim 2, wherein the light emitting and sensing module further comprises:
   a plurality of first electrodes, connected to the first doped semiconductor layers of the light emitting units of the pixels respectively;
   a plurality of second electrodes, connected to the third doped semiconductor layers of the light sensing units of the pixels respectively, and electrically connected to the second doped semiconductor layers of the light emitting units; and
   an electrode layer, electrically connected to the fourth doped semiconductor layers of the light sensing units of the pixels.

7. The photography and projection apparatus according to claim 6, wherein the second electrodes pass through the light emitting units respectively through a plurality of through holes.

8. The photography and projection apparatus according to claim 6, wherein the light emitting and sensing module further comprises:
   a plurality of light emitting unit drive circuits, driving the light emitting units respectively through the first electrodes and the corresponding second electrodes; and
   a plurality of light sensing unit drive circuits, driving the light sensing units respectively through the second electrodes and the electrode layer.

9. The photography and projection apparatus according to claim 1, wherein the light emitting unit array and the light sensing unit array are alternately disposed.

10. The photography and projection apparatus according to claim 1, wherein each of the pixels further comprises a conductive substrate, and both the light sensing unit and the light emitting unit of the pixel are disposed on the conductive substrate.

11. The photography and projection apparatus according to claim 10, wherein the light sensing unit is a Schottky sensor.

12. The photography and projection apparatus according to claim 10, wherein the light emitting and sensing module further comprises a circuit substrate, and each of the light sensing units further comprises:
   a Schottky contact, disposed on the conductive substrate; and
   an ohmic contact, disposed on the conductive substrate, wherein the Schottky contact and the ohmic contact are spaced from each other, and
   the light emitting and sensing module further comprises:
   a plurality of third electrodes, electrically connecting the circuit substrate and the Schottky contacts of the light sensing units respectively; and
   a plurality of fourth electrodes, electrically connecting the circuit substrate and the ohmic contacts of the light sensing units respectively.

13. The photography and projection apparatus according to claim 10, wherein the light sensing unit is a Positive-Intrinsic-Negative (PIN) photodiode.

14. The photography and projection apparatus according to claim 10, wherein the light emitting and sensing module further comprises a circuit substrate, the pixels are disposed on the circuit substrate, and each of the light sensing units further comprises:
   a depletion area, formed on a surface of the conductive substrate; and
   a doped well area, formed in the depletion area, wherein a doping state of the doped well area is opposite to that of the conductive substrate, and
   the light emitting and sensing module further comprises a plurality of second electrodes, respectively disposed on the doped well areas of the light sensing units, and respectively electrically connected to the doped well areas and the circuit substrate.

15. The photography and projection apparatus according to claim 1, further comprising a control unit, electrically connected to the light emitting unit array and the light sensing unit array, so as to alternately drive the light emitting unit array to emit light and drive the light sensing unit to detect light.

16. The photography and projection apparatus according to claim 1, wherein the projection apparatus further comprises a control unit, the control unit is adapted to drive the light emitting units of a first part of the pixels to emit light in a time period, and drive the light sensing units of a second part of the pixels to detect the light simultaneously, wherein the first part of the pixels is respectively adjacent to the second part of the pixels.

17. The photography and projection apparatus according to claim 1, wherein each of the light emitting units comprises:
   a first doped semiconductor layer;
   a second doped semiconductor layer; and
   a light emitting layer disposed between the first doped semiconductor layer and the second doped semiconductor layer, and
   each of the light sensing units comprises:
   a fifth doped semiconductor layer connected to the second doped semiconductor layer;
   a first Schottky contact disposed on the fifth doped semiconductor layer; and
   a second Schottky contact disposed on the fifth doped semiconductor layer, wherein the first Schottky contact and the second Schottky contact are spaced from each other, and
   the light emitting and sensing module further comprises a circuit substrate, wherein the fifth doped semiconductor layer is electrically connected to the circuit substrate through the first Schottky contact and the second Schottky contact.

18. The photography and projection apparatus according to claim 1, wherein the light emitting unit array is configured to convert an output signal into the image beam, the projection lens is configured to transmit the image beam to another photograph and projection apparatus, a projection lens of the another photograph and projection apparatus is configured to form an image of the image beam on a light sensing unit array of the another photography and projection apparatus, and the light sensing unit array of the another photography and projection apparatus is configured to convert the image beam into an input signal.

19. A light emitting and sensing module, comprising:
   a light emitting and sensing area;
   a light emitting unit array, comprising a plurality of light emitting units arranged in an array, wherein the light emitting units are distributed in the light emitting and sensing area;
   a light sensing unit array, comprising a plurality of light sensing units arranged in an array, wherein the light sensing units are distributed in the light emitting and sensing area, and each of the light sensing units and a corresponding one of the light emitting units form a pixel; and
   a circuit substrate, wherein the light emitting units and the light sensing units are disposed on the circuit substrate, and the circuit substrate comprises:
   a plurality of light emitting unit drive circuits, electrically connected to the light emitting units respectively; and
   a plurality of light sensing unit drive circuits, electrically connected to the light sensing units respectively;
   wherein a light isolation structure is disposed between two adjacent pixels, so as to prevent light emitted by a light emitting unit in a pixel from being detected by a light sensing unit in an adjacent pixel, and wherein in each of the pixels, the light isolation structure is not disposed between the light sensing unit and the corresponding light emitting unit.

20. The light emitting and sensing module according to claim 19, wherein each of the light emitting units comprises:
   a first doped semiconductor layer;
   a second doped semiconductor layer; and
   a light emitting layer disposed between the first doped semiconductor layer and the second doped semiconductor layer, and
   each of the light sensing units comprises:
   a fifth doped semiconductor layer connected to the second doped semiconductor layer;
   a first Schottky contact disposed on the fifth doped semiconductor layer; and
   a second Schottky contact disposed on the fifth doped semiconductor layer, wherein the first Schottky contact and the second Schottky contact are spaced from each other, and
   the light emitting and sensing module further comprising a circuit substrate, wherein the fifth doped semiconductor layer is electrically connected to the circuit substrate through the first Schottky contact and the second Schottky contact.

21. The photography and projection apparatus according to claim 19, wherein each of the light sensing units further comprises a depletion area formed on a surface of the conductive substrate, and the light emitting and sensing module further comprises a plurality of second electrodes disposed on the depletion areas of the light sensing units respectively and contacting the depletion areas.

22. A photography and projection apparatus, comprising:
a light emitting and sensing module having a light emitting and sensing area, the light emitting and sensing module comprising:
a light emitting unit array, comprising a plurality of light emitting units arranged in an array, wherein the light emitting units are distributed in the light emitting and sensing area and the light emitting unit array is adapted to provide and image beam; and
a light sensing unit array, comprising a plurality of light sensing units arranged in an array, wherein the light sensing units are distributed in the light emitting and sensing area, and the light sensing units respectively correspond to the light emitting units in a one-to-one manner so as to form a plurality of pixels, and
a projection lens, disposed on a transmission path of the image beam;
wherein a light isolation structure is disposed between two adjacent pixels, so as to prevent light emitted by a light emitting unit in a pixel from being detected by a light sensing unit in an adjacent pixel, and wherein in each of the pixels, the light isolation structure is not dispose between the light sensing unit and the corresponding light emitting unit.

23. The photography and projection apparatus according to claim 22, wherein the light emitting unit array and the light sensing unit array are alternately disposed.

24. The photography and projection apparatus according to claim 22, wherein each of the pixels further comprises a conductive substrate, and both the light sensing unit and the light emitting unit of the pixel are disposed on the conductive substrate.

25. The photography and projection apparatus according to claim 22, wherein the light emitting unit array is configured to convert an output signal into the image beam, the projection lens is configured to transmit the image beam to another photograph and projection apparatus, a projection lens of the another photograph and projection apparatus is configured to form an image of the image beam on a light sensing unit array of the another photography and projection apparatus, and the light sensing unit array of the another photography and projection apparatus is configured to convert the image beam into an input signal.

26. The photography and projection apparatus according to claim 22, wherein in every pixel, the light sensing unit is located at a same side of the light emitting unit.

* * * * *